United States Patent [19]

Kurihara et al.

[11] Patent Number: 5,538,765
[45] Date of Patent: Jul. 23, 1996

US005538765A

[54] DC PLASMA JET CVD METHOD FOR PRODUCING DIAMOND

[75] Inventors: Kazuaki Kurihara; Kenichi Sasaki; Tsukasa Itani; Motonobu Kawarada, all of Kawasaki, Japan

[73] Assignee: Fujitsu Ltd., Kawasaki, Japan

[21] Appl. No.: 417,787

[22] Filed: Apr. 5, 1995

Related U.S. Application Data

[62] Division of Ser. No. 57,823, May 7, 1993.

[30] Foreign Application Priority Data

| May 7, 1992 | [JP] | Japan | 4-113852 |
| Oct. 20, 1992 | [JP] | Japan | 4-282006 |

[51] Int. Cl.$^6$ .................. B05D 3/06; H05H 1/24
[52] U.S. Cl. .................. 427/577; 427/580; 427/249; 427/122; 423/446
[58] Field of Search .................. 427/577, 249, 427/580, 122, 450; 423/446; 118/723 DC, 723 E

[56] References Cited

U.S. PATENT DOCUMENTS

| 3,949,188 | 4/1976 | Tateno | 219/121 |
| 3,980,802 | 9/1976 | Paton et al. | 219/121 |
| 5,070,274 | 12/1991 | Yoshikawa et al. | 315/111 |
| 5,135,807 | 8/1992 | Ito et al. | 427/248.1 |
| 5,180,571 | 1/1993 | Hosoya et al. | 117/95 |
| 5,217,700 | 6/1993 | Kurihara et al. | 427/450 |
| 5,235,160 | 8/1993 | Suzuki et al. | 219/121 |
| 5,260,106 | 11/1993 | Kawarada et al. | 427/577 |
| 5,314,726 | 5/1994 | Kurihara et al. | 427/249 |
| 5,336,326 | 8/1994 | Karner et al. | 118/723 HC |
| 5,349,154 | 9/1994 | Harker et al. | 427/575 |
| 5,368,897 | 11/1994 | Kurihara et al. | 427/450 |
| 5,382,293 | 1/1995 | Kawarada et al. | 118/723 DC |

FOREIGN PATENT DOCUMENTS

| 62-124080 | 6/1987 | Japan . |
| 1-33096 | 2/1989 | Japan . |

OTHER PUBLICATIONS

Ohtake et al., "Diamond Film Preparation by Arc Discharge Plasma Jet Chemical Vapor Deposition in the Methane Atmosphere", *J. Electrochem. Soc.*, vol. 137, No. 2, Feb. 1990.

*Primary Examiner*—Roy V. King
*Attorney, Agent, or Firm*—Staas & Halsey

[57] ABSTRACT

A process for producing diamond includes a step of bringing a columnar cathode and a tubular pilot anode provided concentrically around the cathode, into proximity to a plasma jetting port of a front end portion of a tubular main anode provided concentrically around the pilot anode. According to the process, a voltage is applied across the cathode and the pilot anode to convert a pilot gas to the form of a plasma. Then, the cathode is moved away from the pilot anode along a common axis. The process also includes the step of holding the discharge voltage between the cathode and the pilot anode at a first preselected voltage, and then applying voltage across the cathode and the main anode to convert a main gas to the form of a plasma. Subsequently, at least the pilot anode is moved away from the main anode along the common axis while maintaining the discharge voltage between the cathode and the pilot anode at the first preselected voltage. The process further includes the steps of holding the discharge voltage between the cathode and the main anode at a second preselected voltage and jetting the main gas in the form of plasma from the jetting port while generating a main arc between the main anode and the cathode.

7 Claims, 25 Drawing Sheets

Fig.4
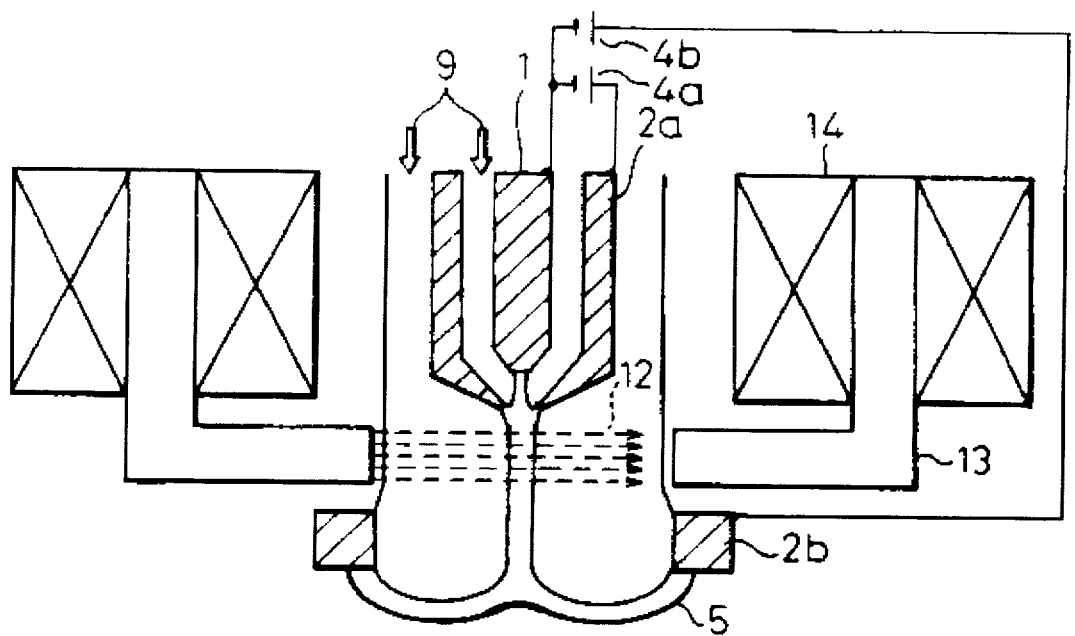
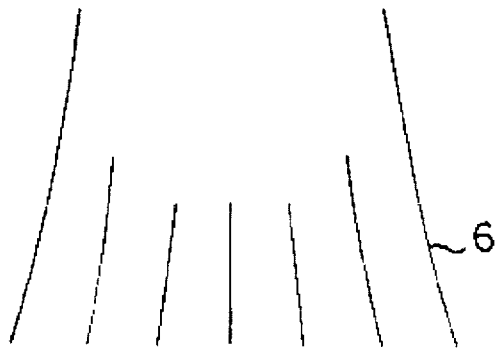

CHANGE OVER TIME OF DISCHARGE VOLTAGE

DC PLASMA JET CVD METHOD FOR PRODUCING DIAMOND

This application is a division of application Ser. No. 08/057,823 filed May 7, 1993, now pending.

BACKGROUND OF THE INVENTION

1. Field of the Invention

The present invention relates to a process and apparatus for production of diamond, more particularly relates to a process and apparatus for production of diamond which performs gas phase synthesis of high quality diamond at a high speed.

2. Description of the Related Art

Diamond is the hardest material on earth, having a Vicker's hardness of 10000. It also has a large Young's modulus and is superior in wear resistance and chemical stability. Due to these superior properties, diamond is an essential material in industry, in particular the high tech industries. Further, diamond has a heat conductivity of 2000 W/mK, four times that of copper, and is transparent in a wide range of wavelength from the infrared to ultraviolet. Further, it is a semiconductor with a wide bandgap of 5.4 eV. Therefore, diamond is expected to be put to use for heat sinks, heat radiating circuit boards, optical materials (window materials), heat resistant semiconductor devices, wear resistant coatings for tools and other objects, etc.

In recent years, there has been considerable research done in the synthesis of diamond by the chemical vapor deposition method (CVD method). For commercial use of gas phase synthesized diamond, it is important to increase the speed of synthesis so as to reduce the manufacturing cost.

Many processes have been proposed as the process for gas phase synthesis of diamond. By the DC plasma jet CVD method developed by the present inventors (see Japanese Unexamined Patent Publication (Kokai) No. 64-33096), it is possible to synthesis diamond at a high production or film-forming speed of over 100 μm/hour.

FIG. 1 is a view for explaining the structure of a plasma torch of a conventional diamond producing apparatus.

In FIG. 1, 1 is circular columnar cathode with a printed front end, and 2 is an anode provided so as to surround the cathode 1 with a predetermined clearance. By applying DC voltage between the cathode 1 and the anode 2, an arc discharge is caused and reaction gas introduced in the clearance between the cathode 1 and anode 2 is converted to plasma in the clearance. Reference numeral 3 is a gas introduction port for introduction of the reaction gas in the clearance between the cathode 1 and the anode 2.

When using a production apparatus having the above plasma torch to synthesize diamond, a substrate 7 is placed at a position facing the plasma torch, reaction gas is introduced from the gas introduction port 3 in the clearance between the cathode 1 and the anode 2, voltage is applied between the cathode 1 and the anode 2 to cause an arc discharge, and the reaction gas introduced in the clearance is converted to plasma. Due to this, an arc column 5 is produced from the front end of the cathode 1 to the jetting port of the plasma jet 6 of the anode 2.

The plasma jet 6 is jetted from the jetting port of the front end of the plasma torch toward the substrate 7. This state is held for a predetermined time, whereby a diamond film 8 is formed on the substrate 7.

In general, with a DC arc discharge, even with the same discharge power, if the arc column 5 is made longer, the discharge voltage raised, and the discharge current lowered, there is less consumption of the electrode material of the anode 2 and the rate of voltage fluctuation also drops. Further, in synthesis of diamond, in the case of the same discharge power, the higher the discharge voltage is made, the faster the speed of synthesis becomes as a general trend (see FIG. 2). In this way, lengthening the arc column and raising the discharge voltage are very effective in reducing the electrode consumption of the cathode 1 and the anode 2, improving the stability of the discharge, raising the purity of the synthesized diamond film, improving the quality, and raising the speed of synthesis.

However, if the arc column 5 is made too long, the arc easily disappears and so there were limits to the conventional method of using a DC arc discharge. That is, there were the problems that the electrode materials of the cathode 1 and the anode 2 easily were mixed in the diamond film 8 as impurities or that the discharge was unstable and there was insufficient reproducibility. Further, the angle of spread of the plasma jet was narrow and only a small area of synthesis was possible. In this way, it was difficult with the conventional process to stably synthesize a high quality diamond film 8 over a large area.

SUMMARY OF THE INVENTION

Accordingly, the object of the present invention is to solve the above problems in the prior art and provide a process and apparatus for producing diamond which enables a high purity and high quality diamond film to be stably produced at a high speed, over a large area, and with good reproducibility.

According to a first aspect of the present invention, there is provided an apparatus for producing diamond having a columnar cathode which can be moved along a common axis, a tubular main anode which is provided concentrically with said cathode set apart with a clearance therewith and with a front end serving as a plasma jetting port, a tubular pilot anode which is provided concentrically with said cathode and main anode in the clearance between said cathode and said main anode set apart with a clearance therewith and able to be moved along said common axis, a pilot gas introduction port which introduces pilot gas to the clearance between said cathode and said pilot anode, a main gas introduction port which introduces main gas to the clearance between said main anode and said pilot anode, a main power supply which connects said main anode and said cathode, an auxiliary power source which is connected between said cathode and said pilot anode, and a substrate holder which is provided at a position facing said jetting port and holds a substrate on which a diamond film is to be formed.

The apparatus preferably has a gas introduction nozzle which is provided in proximity to the plasma jetting port of said main anode and mixes gas with plasma jetted from said jetting port. Further, the diamond producing apparatus preferably has a pressure reducible chamber in which said cathode, said main anode, and said pilot anode are housed and further a gas introduction port for introducing gas in said chamber is provided in a wall of said chamber.

According to a second aspect of the present invention, there is provided a process for producing diamond comprised of bringing both a columnar cathode and a tubular pilot anode, provided concentrically around said cathode set apart with a clearance with said cathode, into proximity to a plasma jetting port of a front end portion of a tubular main anode, provided concentrically around said pilot anode set apart with a clearance with said pilot anode, applying voltage across said cathode and said pilot anode to convert to plasma a pilot gas introduced in the clearance between said cathode and said pilot anode, then moving the cathod which is near said pilot anode away from said pilot anode along a common axis, holding the discharge voltage between said cathode and said pilot anode at a predetermined voltage, then applying voltage across said cathode and said main anode to convert to plasma a main gas introduced to the clearance between said main anode and said pilot anode, then moving the pilot anode which is close to the main anode away from the main anode along said common axis while holding the discharge voltage between said cathode and said pilot anode as it is, holding the discharge voltage between said cathode and said main anode at a predetermined voltage, and jetting plasma from said jetting port in the state when holding a main arc generated between said main anode and said cathod.

In the above process, said pilot gas is preferably argon gas or another inert gas and said main gas is preferably a mixed gas of hydrogen gas or an inert gas and a gas comprised of a carbon compound. Further, it is possible to introduce a gas including the carbon compound gas into the plasma Jetted from the plasma jetting port of said main anode so as to suitably produce the desired diamond. Note that as the pilot gas, use is preferably made of argon gas or another inert gas, said main gas is preferably hydrogen gas or an inert gas. Further, a desired diamond may suitably be produced by producing diamond according to the present invention in a chamber reduced in pressure and introducing atmospheric gas into said chamber from a gas introduction port provided in a wall of said chamber. In preferable aspect of the present invention, it is possible to produce diamond from a pilot gas which is argon gas or another inert gas, a main gas which is hydrogen gas or an inert gas, and atmospheric gas which is a gas comprised of a carbon compound. Further, according to the present invention, there is provided a process for producing diamond wherein the pilot gas is argon gas or another inert gas, said main gas is hydrogen gas or an inert gas, and said atmospheric gas is a mixed gas comprised of a gas comprised of a carbon compound, an oxidizing gas, halogen gas, or halogenated hydrogen gas.

According to a third aspect of the present invention, there is provided a process for gas phase synthesis of diamond by a DC plasma jet wherein a plasma jet produced by DC arc discharge using a DC plasma torch is made to strike a substrate to grow diamond on the substrate, said diamond gas phase synthesis process having a plurality of plasma torch anodes arranged coaxially in a telescoped structure.

In the third aspect, preferably part or all of the electrodes of said plasma torch are of a construction enabling movement in the axial direction of the torch and the electrodes are made to move and the discharge voltage changed during the generation of the plasma jet. Further, according to a preferred aspect of the present invention, a desired diamond can be produced by gas phase synthesis by applying a magnetic field in the axial direction of said plasma torch and causing a Lorentz force to act on the arc column to forcibly cause the anode point to rotate.

According to a fourth aspect of the present invention, there is provided an apparatus for gas phase synthesis of diamond by the DC plasma jet diamond gas phase synthesis process wherein a non-transfer type plasma torch which generates a plasma jet by DC arc discharge, a substrate holder, and a movement mechanism which enables the positions of the plasma torch and substrate holder to be changed are disposed in a reduced pressure chamber to which a vacuum pump is connected, said apparatus for gas phase synthesis of diamond having a plurality of anodes of the plasma torch arranged coaxially in a telescoped structure.

In the fourth aspect of the present invention, part or all of the electrodes of the plasma torch are able to move in the axial direction of the torch during generation of the plasma jet, one or a plurality of nozzles for blowing gas to the plasma jet generated from the plasma torch may be provided at the outside of the main anode and a gas supply system for supplying gas to the nozzles may be connected to the nozzles, and there may be a permanent magnet or electromagnet for applying a magnetic field in the axial direction of the plasma torch and causing a Lorentz force to act on the arc column so as to forcibly rotate the anode point.

According to a fifth aspect of the present invention, there is provided a process for gas phase synthesis of diamond using a DC plasma jet which causes a plasma jet generated by DC arc discharge using a DC plasma torch to strike a substrate to cause growth of diamond on the substrate, said process for gas phase synthesis of diamond comprised by applying a magnetic field to the arc from a direction orthogonal to the axial direction of the torch so as to cause deflection of the plasma jet so as to broaden the area of irradiation of the plasma jet and enable an increase in the area of synthesis of the diamond and by having a plurality of anodes of the plasma torch arranged coaxially in a telescoped structure.

According to a sixth aspect of the present invention, there is provided a process for gas phase synthesis of diamond, using a DC plasma jet which causes a plasma jet generated by DC arc discharge using a DC plasma torch to strike a substrate to cause growth of diamond on the substrate, said process for gas phase synthesis of diamond comprised by applying a magnetic field to the plasma jet from a direction orthogonal to the axial direction of the torch so as to cause deflection of the plasma jet so as to broaden the area of irradiation of the plasma jet and enable an increase in the area of synthesis of the diamond and by having a plurality of anodes of the plasma torch arranged coaxially in a telescoped structure.

In the fifth and sixth aspects, preferably a magnetic field is applied to the plasma jet from a direction orthogonal to the axial direction of the torch so as to cause deflection of the plasma Jet and thereby broaden the area of irradiation of the plasma jet and increase the area of synthesis of the diamond. A preferable method of application of the deflecting magnetic field is to apply a magnetic field from mutually orthogonal X and Y two directions in a plane orthogonal to the axial direction of the torch so as to enable the direction of the combined magnetic field to be freely changed within said plane, whereby the direction of the deflection of the plasma jet can be changed two-dimensionally within the plane.

According to a seventh embodiment of the present invention, there is provided an apparatus for synthesis of diamond by the DC plasma jet diamond gas phase synthesis process wherein a non-transfer type plasma torch which generates a plasma jet by DC arc discharge, a substrate holder, and a movement mechanism which enables the positions of the plasma torch and substrate holder to be changed are disposed in a reduced pressure chamber to which a vacuum pump is connected, said apparatus for gas phase synthesis of diamond having connected to it an electromagnet, and a control device for the same, able to apply a magnetic field to the arc from between the cathode and anode in a direction orthogonal to the axial direction of the torch, and having a plurality of anodes of the plasma torch arranged coaxially in a telescoped structure.

According to an eighth embodiment of the present invention, there is provided an apparatus for synthesis of diamond by the DC plasma jet CVD process wherein a non-transfer type plasma torch which generates a plasma jet by DC arc discharge, a substrate holder, and a movement mechanism which enables the positions of the plasma torch and substrate holder to be changed are disposed in a reduced pressure chamber to which a vacuum pump is connected, said apparatus for gas phase synthesis of diamond having connected to it an electromagnet, and a control device for the same, able to apply a magnetic field to the plasma jet from outside the anodes in a direction orthogonal to the axial direction of the torch, and having a plurality of anodes of the plasma torch arranged coaxially in a telescoped structure.

In the seventh and eighth aspects of the present invention, the electromagnet is preferably comprised of two systems of electromagnets able to apply a magnetic field from the mutually orthogonal X and Y two directions in a plane orthogonal to the axial direction of the torch.

According to a ninth embodiment of the present invention, there is provided a process for gas phase synthesis of diamond by a DC plasma jet wherein a plasma jet generated by DC arc discharge using a DC plasma torch is made to strike a substrate to cause growth of diamond on the substrate, said process for gas phase synthesis of diamond having a plurality of anodes of the plasma torch arranged coaxially in a telescoped structure and having the relative positions of the electrodes being able to be changed so as to enable a change of the discharge position of the plasma and stabilization of the discharge.

In this aspect, preferably the cathode serving as the discharge electrode for generating the plasma jet is made variable, the cathode is made to rotate about the axial line of the torch so as to make the discharge position variable, the cathode is made to vibrate at any desired oscillation frequency so as to make the discharge position variable, the anode serving as the discharge electrode for generating the plasma jet is made variable, the anode is made to rotate about the axial line of the torch so as to make the discharge position variable, or the anode is made to vibrate at any desired oscillation frequency so as to make the discharge position variable.

According to a tenth aspect of the present invention, there is provided an apparatus for synthesis of diamond by the DC plasma jet CVD process wherein a non-transfer type plasma torch which generates a plasma jet by DC arc discharge, a substrate holder, and a movement mechanism which enables the positions of the plasma torch and substrate holder to be changed are disposed in a reduced pressure chamber to which a vacuum pump is connected, said apparatus for synthesis of diamond being provided with an anode electrode and cathode electrode for arc discharge and an electrode drive means for changing the relative positions of the discharge electrodes and having a plurality of anodes of the plasma torch arranged coaxially in a telescoped structure.

In this aspect, preferably said electrode drive means drives the cathode and causes rotation about the axial line of the torch so as to make the discharge position variable, said electrode drive means drives the anode and causes rotation about the axial line of the torch so as to make the discharge position variable, or said drive means is a motor.

BRIEF DESCRIPTION OF THE DRAWINGS

The present invention will be better understood from the description set-forth below with reference to the accompanying drawings, wherein:

FIG. 4 is a structural view showing the principle of a diamond producing apparatus according to a fifth aspect of the present invention;

DESCRIPTION OF THE PREFERRED EMBODIMENTS

Figure 1:
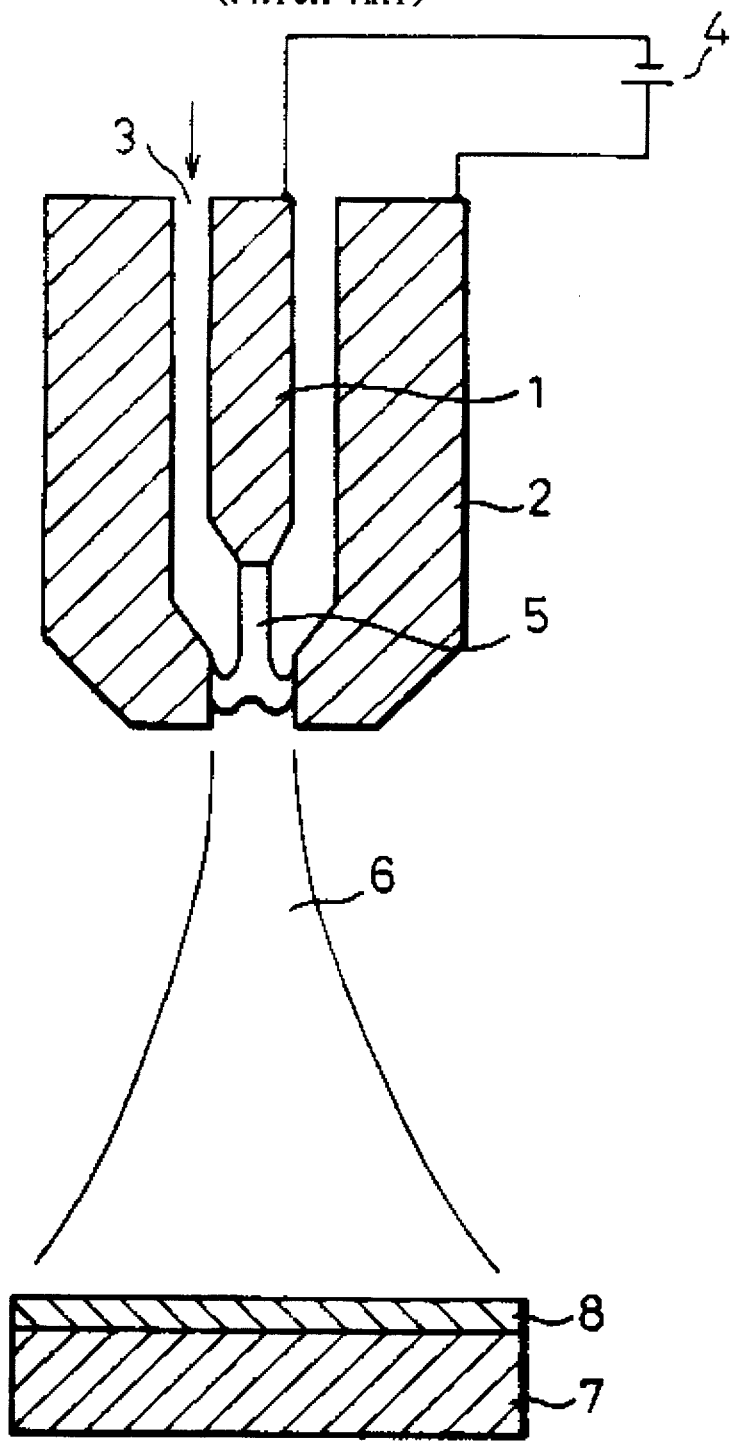
FIG. 1 is a detailed structural view of a plasma torch of a diamond producing apparatus according to the prior art.

In the diamond producing apparatus according to the first aspect of the present invention, the construction is such that a tubular pilot anode is interposed concentrically in the clearance between a columnar cathode and a tubular main anode, provided concentrically with the cathode set apart with a clearance from the same, set apart with a clearance from the columnar cathode and the tubular anode and that the cathode and anode can be moved along a common axis. Further, an auxiliary power source is connected between the cathode and pilot anode, a main power source is connected between the main anode and cathode, and there are a pilot gas introduction port for introducing pilot gas in the clearance between the cathode and the pilot anode and a main gas introduction port for introducing main gas in the clearance between the main anode and the pilot anode.

Therefore, with the process for producing diamond in accordance with the second aspect of the present invention, it is possible to synthesize diamond by bringing both the cathode and pilot anode into proximity with the plasma jetting port, that is, the front end portion of the main anode, applying voltage across said cathode and said pilot anode to convert to plasma a pilot gas introduced in the clearance between said cathode and said pilot anode, then moving the cathode which is near said pilot anode away from said pilot anode along a common axis, holding the voltage between said cathode and said pilot anode at a predetermined voltage, then applying voltage across said cathode and said main anode to convert to plasma a main gas introduced to the clearance between said main anode and said pilot anode, then moving the pilot anode which is close to the main anode away from the main anode along said common axis, holding the discharge voltage between said cathode and said main anode at a predetermined voltage, and jetting plasma from said jetted port in the state when holding a main arc generated between said main anode and said cathod.

By this, using the pilot arc generated in the clearance between the cathode and the pilot anode, it is possible to control the discharge voltage between the cathode and main anode while preventing extinguishment of the main arc generated in the clearance between the cathode and the main anode. In particular, by reducing the electrode distance between the cathode and the main anode when igniting the main arc and increasing the electrode distance between the cathode and main anode after the main arc is generated, it is possible to make the discharge voltage between the cathode and the main anode much higher compared with the prior art. Due to this, it possible to stably produce a high purity and high quality diamond film at a high speed and with a good reproducibility.

Further, as the pilot gas, argon (Ar) gas, which gives a stable discharge, is most suitable, but helium (He) gas and other inert gases or hydrogen ($H_2$) gas may also be included. Further, the main gas is preferably mainly $H_2$ gas, which has a high discharge voltage and plays an important role in the gas phase synthesis of diamond, but Ar gas, He gas, and other inert gases may also be included.

Further, to synthesize the diamond, a gas comprised of carbon compounds serving as the feedstock of the diamond must be fed in the plasma. As the feed method, there are the methods of mixing it with the main gas, blowing it into the plasma from the gas introduction nozzle outside the main anode, or introducing it in the chamber as atmospheric gas. The method of feeding it as pilot gas is not preferable since it lowers the stability of the pilot arc.

Further, to improve the quality of the diamond film, oxygen, steam, or other oxidizing gases, halogen gases, halogenated hydrogen gas, etc. may also be fed in the plasma. In this case, as the feed method, there are the methods of mixing it with the main gas, blowing it into the plasma from the gas introduction nozzle outside the main anode, or introducing it into the chamber as atmospheric gas. The method of feeding it as pilot gas is not preferable since it lowers the stability of the pilot arc.

In the third aspect of the present invention, in the DC plasma jet CVD process, by making the anode of the plasma torch a telescoped structure, the arc can be stabilized and the electrode consumption reduced and further by causing generation of plasma with a large angle of spread of the plasma jet, it is possible to synthesize high purity and high quality diamond.

Further, in the fourth aspect of the present invention, by applying a magnetic field to the arc column and forcibly causing the anode point to rotate, the arc is stabilized and the electrode consumption is reduced and further by causing generation of plasma with a large angle of spread of the plasma jet, it is possible to synthesize high purity and high quality diamond over a large area.

Figure 2:
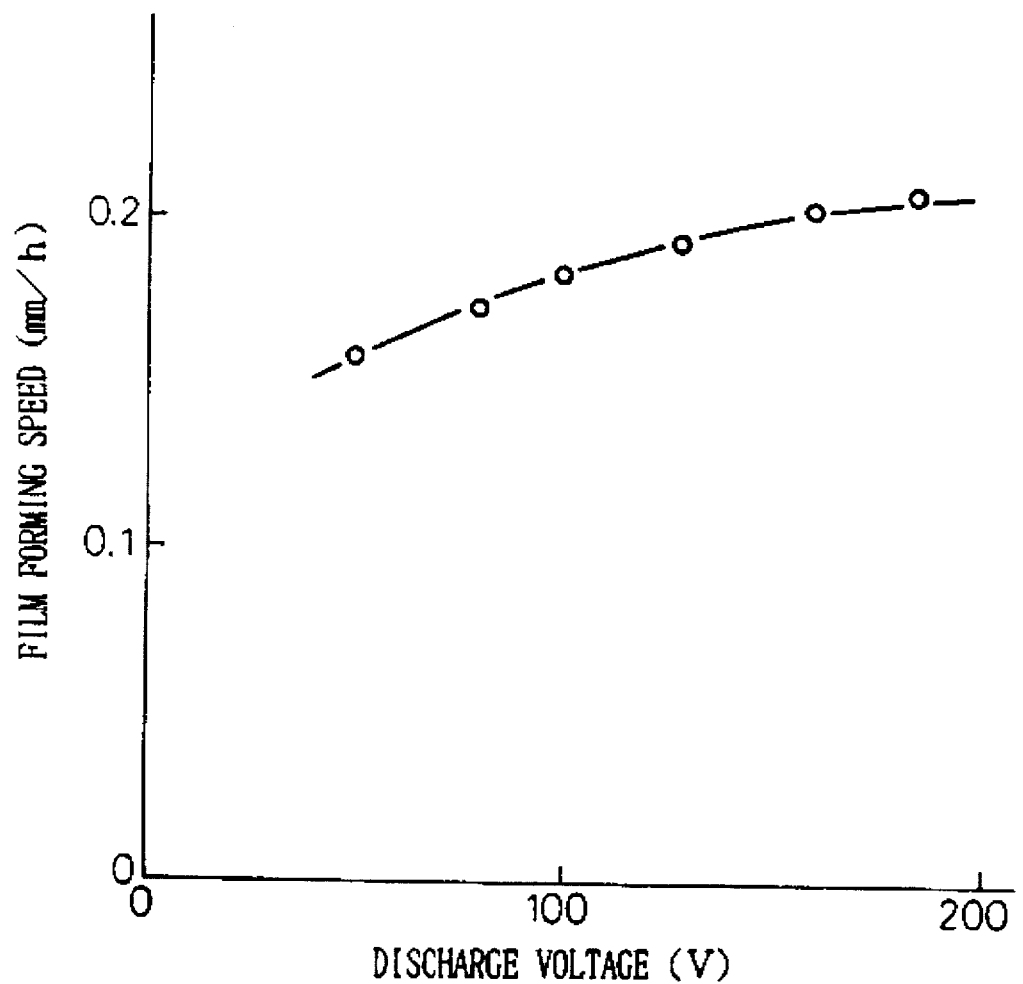
FIG. 2 is a graph showing the relationship between the discharge voltage and film-forming speed in gas phase synthesis of diamond.

Regarding the third aspect, in general, with a DC arc discharge, with the same discharge power, elongating the arc column, raising the discharge voltage, and lowering the discharge current results in less electrode consumption and further a smaller voltage fluctuation rate. Further, in diamond synthesis, in the case of the same discharge power, the higher the discharge voltage is made, the faster the speed of synthesis tends to become (see FIG. 2). In this way, elongating the arc column and raising the discharge voltage can be expected to have such major effects as reducing the electrode consumption, improving the stability of the discharge voltage, raising the purity and quality of the diamond which is synthesized, and raising the speed of synthesis. If the arc is made too long, however, the arc tends to easily disappear (or extinguish), so there are limits to this method.

Further, the plasma jet is ejected from a narrow anode nozzle, so the angle of spread of the plasma jet is small and the area of the film which is formed is small as well. Even if the nozzle diameter is made larger, there is little effect since the thermal plasma itself acts to reduce the surface area and reduce the diffusion of the heat. Further, if the nozzle diameter is made too large, the arc length becomes long and the arc easily is extinguished.

In the third aspect of the present invention, the above problems are attempted to be resolved by making the anode a telescoped structure. That is, (1) By providing a plurality of anodes, the arc current is dispersed and the consumption of the anodes lowered.

(2) Separate roles are assigned to each of the anodes, e.g., providing an anode for maintaining the plasma, a main anode for generating the plasma jet, and an anode for spreading the plasma jet.

(3) Even under conditions where there is no discharge with a single anode, a plasma jet is continually generated by the other anodes, so the discharge can be maintained even under such conditions.

(4) Since a number of discharges occur, even with voltage fluctuations with individual electrodes, the effects are averaged out and become smaller.

Figure 3:
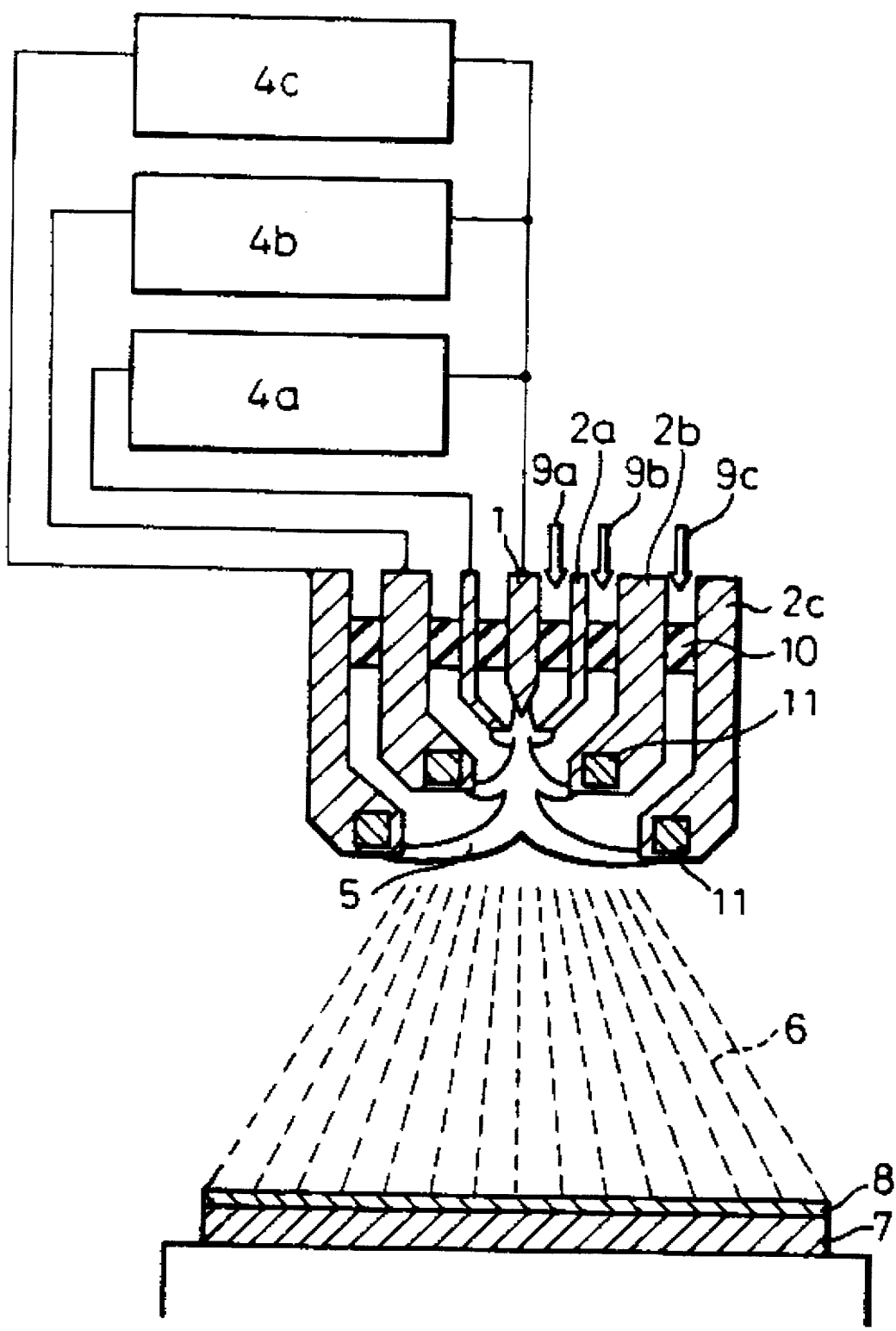
FIG. 3 is a structural view showing the principle of a producing apparatus of a third aspect of the present invention.

FIG. 3 shows the principle of the third aspect of the present invention and shows the synthesis of diamond by a plasma torch having a representative three anodes. In the figure, 1 is a cathode, 2a is a first anode, 2b is a second anode, 2c is a third anode, 4a is a first power source, 4b is a second power source, 4c is a third power source, 5 is an arc-column, 6 is a plasma jet, 7 is a substrate, 8 is a diamond film, 9a is a first gas, 9b is a second gas, 9c is a third gas, 10 is an insulator, and 11 is a magnet.

In the example of FIG. 3, the first anode 2a closest to the cathode is the pilot anode for maintaining the discharge. It is low in power and stable in discharge. The second anode 2b is the main anode and generates a high voltage discharge of an arc of a long length which would extinguish with a single anode. The third anode 2c is an electrode for spreading the plasma jet. It has a large nozzle diameter and increases the angle of spread of the plasma jet. As the discharge gas, use is made of Ar, which facilitates a stable discharge, for the first gas 9a, and hydrogen, which plays an important role in the gas phase synthesis of diamond, as the second and third gases 9b and 9c. Methane, which serves as the feedstock for the diamond, is introduced along with the hydrogen as the third gas.

As the discharge gas in the method of the present invention, it is necessary to use hydrogen, which plays an important role in the gas phase synthesis of diamond. Further, Ar, He, and other inert gases are preferable for obtaining a stable discharge. Since there are a plurality of anodes, there are also a plurality of discharge gas introduction ports, so these gases may be fed alone or mixed together in accordance with the torch structure or as needed. Preferably, as the first gas closest to the cathode, use is made of Ar so as to protect the cathode and stabilize the discharge. For the second gas on, use may be made of hydrogen with its high discharge voltage.

To synthesize diamond, a carbon compound gas forming the feedstock of the diamond must be fed into the plasma jet. As the feed method, it may be mixed in the discharge gas, blown from a nozzle outside the anodes into the plasma jet, or fed as atmospheric gas. It may also be fed as the first gas. It is not preferable since it lowers the discharge stability or has a detrimental effect on the cathode.

To improve the quality of the diamond film, oxygen, steam, or other oxidizing gas, a halogen gas, halogenated hydrogen gas, etc. may also be fed into the plasma jet. In this case, as the feed method, it may be mixed in the discharge gas, blown from a nozzle outside the anodes into the plasma jet, or fed as atmospheric gas. It may also be fed as the first gas, but this is not preferable since it lowers the discharge stability or has a detrimental effect on the cathode. To control the discharge voltage, the apparatus is constructed to allow movement of the cathode and the anodes during the discharge. During discharge, the electrodes may be moved to adjust the discharge voltage to a predetermined level. In particular, when igniting the arc, the distance between the electrodes may be made shorter and then when the arc has been generated, the distance between electrodes may be made greater so as to further increase the discharge voltage.

In general, the DC arc discharge is discharged on a line between the cathode point and the anode point. The problem here is that the discharge current concentrates at the single anode point on the anode electrode, so the temperature at that portion becomes extremely high and therefore the anode material evaporates and ends up mixing in the plasma jet. Further, since the anode point moves irregularly, the discharge voltage or the shape of the plasma jet end up changing each time and a stable discharge cannot be obtained. Due to such a problem, usually the plasma gas is fed between the electrodes as a swirling (or rotating or circulating) stream to rotate the anode point. With this method, however, a high gas flow is required to stably rotate the anode point, so the discharge conditions end up being limited.

In the fourth aspect of the present invention, by applying a magnetic field in the axial direction of the torch, a Lorentz force is made to act on the arc to forcibly rotate the anode point, thereby giving the following effects:

(1) The rise of temperature of the anode point is prevented and the entry of impurities into the plasma jet due to evaporation of the anode material is reduced, so the anode lifetime is prolonged.

(2) By averaging together the arc fluctuations, the fluctuations in the discharge voltage and the shape of the plasma jet can be suppressed and a stable plasma jet generated.

(3) Since the spread of the arc becomes greater, the spread of the plasma jet also becomes greater.

(4) Even with a small gas flow which cannot be expected to have a swirl effect, it is possible to easily rotate the anode point.

In the view of FIG. 3, reference numeral 11 is a magnet for rotating the anode point.

As the means for generating the magnetic field, there is the method of using a permanent magnet and the method of using an electromagnet, but it is sufficient if a magnetic field is applied just near the anode point, so use of a permanent magnet is more effective in that it can generate a strong magnetic field with a small volume. As a permanent magnet, a strong magnet of the Nd—Fe—B series or Sm—Co series is preferable. As to the method of placement, a location as close to the anode point as possible is best. Preferably, it is provided in the anode electrode. At this time, it is necessary to take care to prevent a rise in temperature of the magnet or generation of rust due to the coolant water.

FIG. 4 is a conceptual view for explaining a fifth aspect of the present invention. In the figure, 1 is a cathode, 2a a first anode, 2b a second anode, 5 an arc, 6 a plasma jet, 7 a substrate, 8 a diamond film, 9 an introduced gas, 12 lines of magnetic flux, 13 a yoke, and 14 a coil.

If a magnetic field 12 is applied to the arc 5 in a direction orthogonal to the same, a Lorentz force (vertical direction of paper surface in FIG. 4) is generated in the direction orthogonal to the current (arc) and the magnetic field. This Lorentz force causes the arc to bend in the vertical direction of the paper surface. Along with this, the plasma jet is also bent in that direction. If an alternating current is applied to the coil 14 for generating the magnetic field, the direction of the force acting on the arc rises and falls in the vertical direction of the paper surface and the deflection of the plasma jet 6 oscillates. If this plasma jet 6 is impinged on the substrate 7 to synthesize a diamond film 8, the area of formation of the diamond expands in the lateral direction (vertical direction of the paper surface in FIG. 4).

If a magnetic field is applied from the mutually orthogonal X and Y two directions, the direction of the Lorentz force can be freely changed in the XY plane. Therefore, by scanning the direction of deflection of the plasma jet, it is possible to considerably increase the area of synthesis of the diamond.

Further, by deflecting the arc, it is possible to move the contact point between the arc and the anode, that is, the anode point. The anode point becomes extremely high in temperature, so the electrode material evaporates and ends up contaminating the plasma jet, but by deflecting the arc and shortening the time during which the anode point stops at a single point, the consumption of the electrode material is suppressed and the purity of the plasma jet is increased, which is effective in raising the purity of the diamond.

To raise the effect of the magnetic field deflection according to the present invention, it is necessary to increase the diameter of the anode nozzle and lengthen the arc on which the magnetic field acts. If the arc is lengthened, however, the arc easily disappears (easily extinguishes). Therefore, for effective utilization of the present invention, a plasma torch of a telescoped anode structure enabling the arc length to be increased is suitable.

The sixth aspect of the present invention causes a magnetic field to act on the plasma jet ejected from the anode. The plasma jet near the anode is high in temperature and high in degree of electrolytic dissociation. Therefore, it is possible to deflect the plasma jet in the same way as applying a magnetic field to the arc. Further, it is similarly possible to apply a magnetic field from the mutually orthogonal X and Y two directions to change the direction of the Lorentz force in the XY plane.

Compared with the method of applying a magnetic field to the arc as in the fifth aspect of the present invention, this aspect enables the magnetic circuit to be established outside the anodes, so the construction is simpler and there is no need to make the arc length longer or the nozzle diameter larger. The plasma jet, however, is lower in the charge density compared with the arc, so the effect of deflection is smaller and no effect appears on movement of the anode point.

EXAMPLES

The present invention will now be further illustrated by, but is by no means limited to, the following Examples.

Examples 1 to 3

Figure 5:
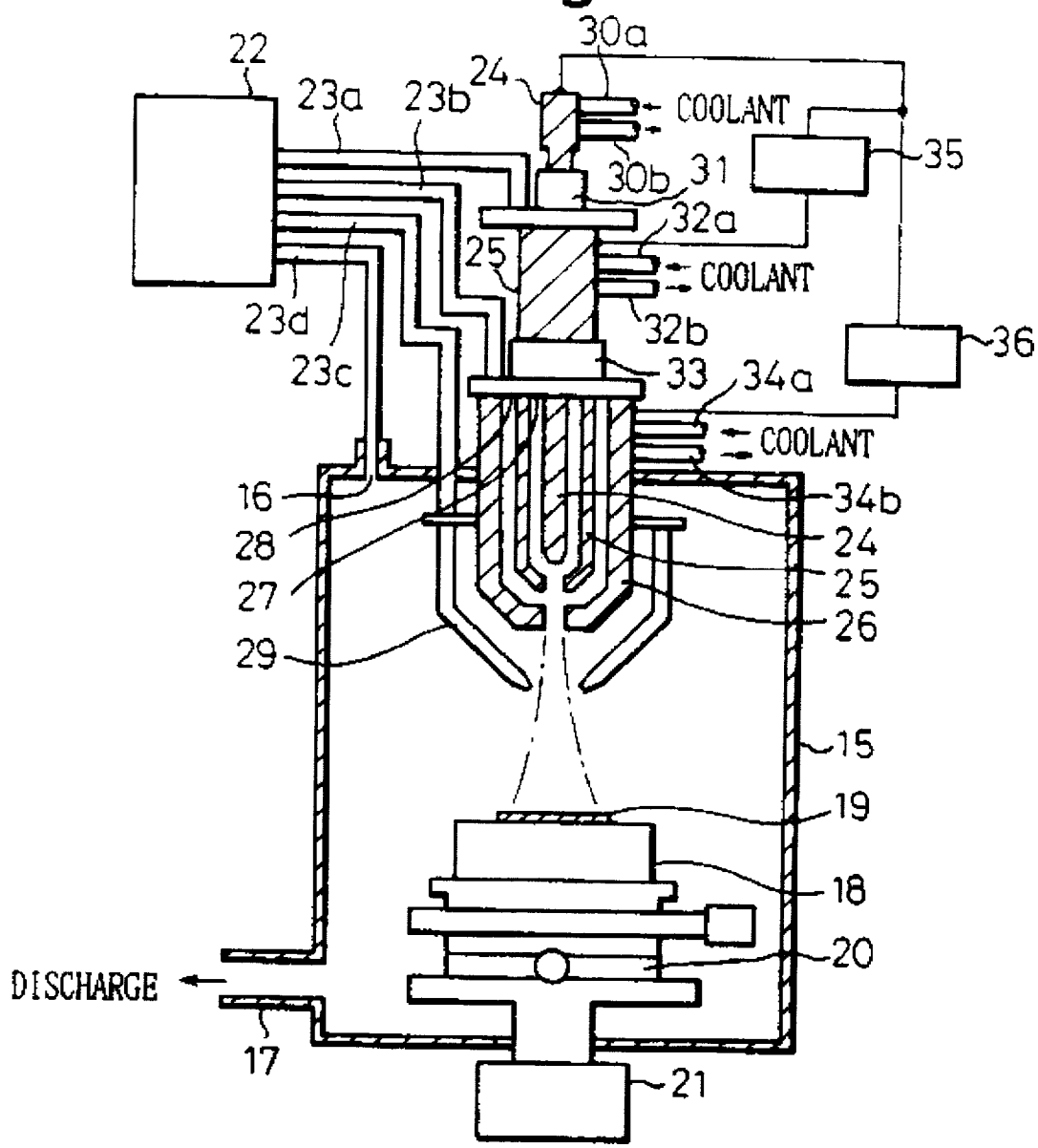
FIG. 5 is a structural view of a diamond producing apparatus according to Example 1 of the present invention.
Figure 6:
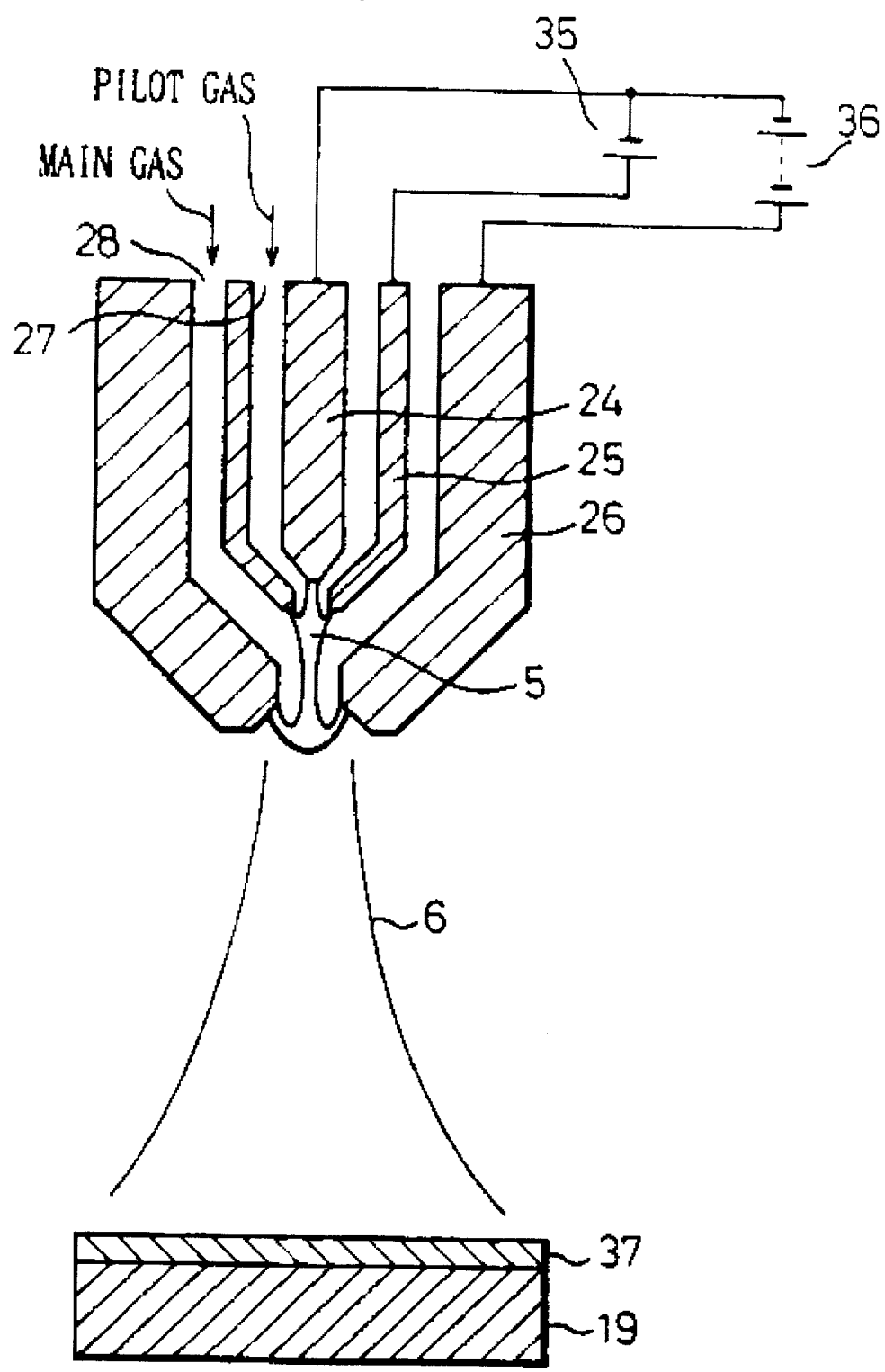
FIG. 6 is a detailed structural view of a plasma torch of a diamond producing apparatus according to Example 1 of the present invention.

FIG. 5 is a constitutional view of an apparatus for producing diamond using a plasma torch according to Example 1 of the present invention, while FIG. 6 is a detailed constitutional view of a plasma torch according to Example 1 of the present invention.

Figure 15:
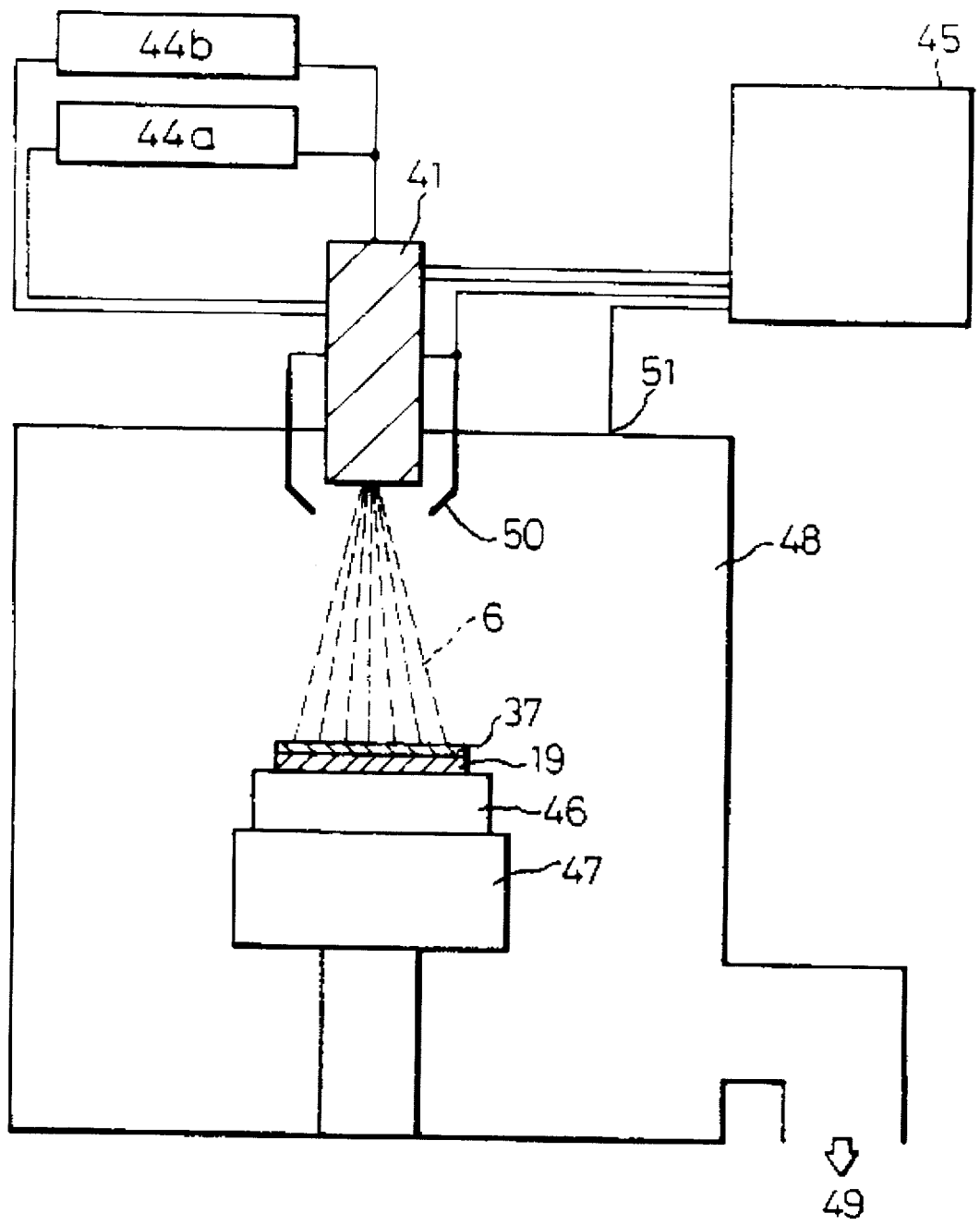
FIG. 15 is a structural view of a diamond producing apparatus according to Example 11 of the present invention.

In FIG. 5 and FIG. 6, 15 is a chamber for synthesis of diamond under reduced pressure, 16 is a gas introduction port for introducing atmospheric gas from outside the chamber 15 to inside the chamber 15, 17 is a port for exhausting the inside of the chamber 15, 18 is substrate holder which carries the substrate 19, 20 is the XY stage, 21 is a linear motor which causes the XY stage 18 to move up and down, and 22 is a gas feed means for feeding various different types of gases required for the formation of a diamond film and which is connected to the gas piping 23a to 23d. The other ends of the gas piping 23a to 23d are connected to the pilot gas introduction port 27 in the clearance between the cathode 24 and the pilot anode 25, the main gas introduction port 28 in the clearance between the main anode 26 and the pilot anode 25, and the gas introduction nozzle 29 and the gas introduction port 16 in the chamber 15 wall.

Figure 7A:
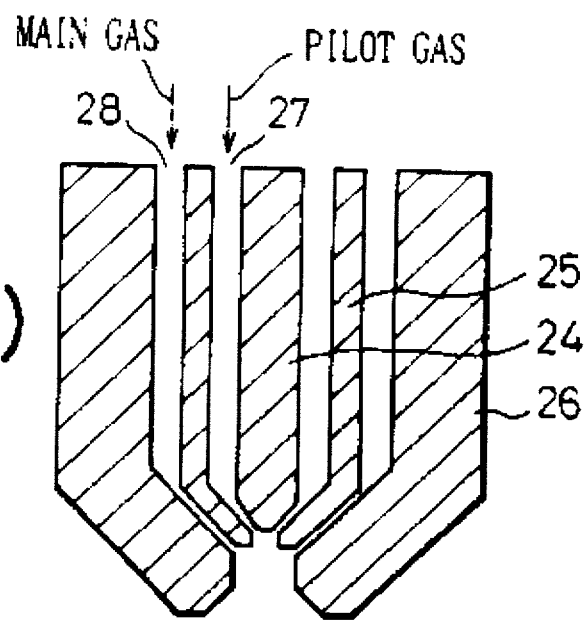
FIGS. 7(a) and 7(b) are side views (part 1) of a plasma torch for explaining the process for producing diamond according to Example 4 of the present invention.
Figure 7B:
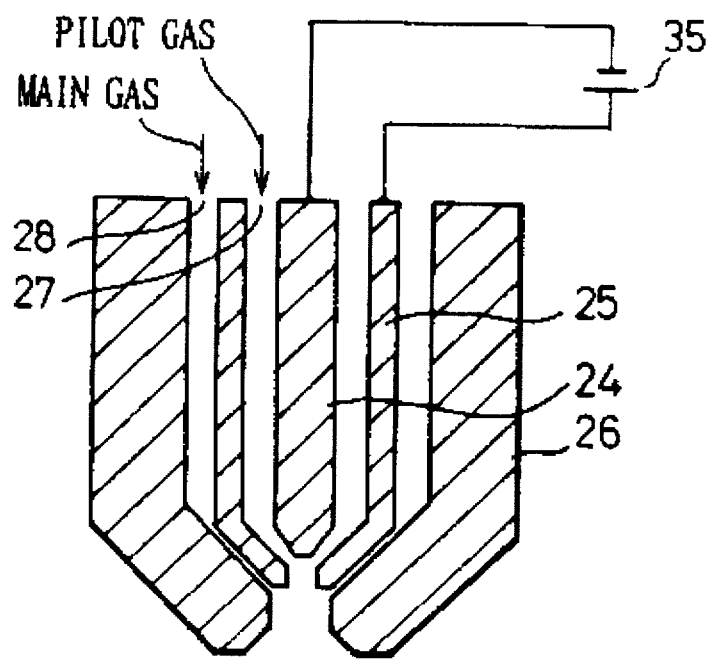
Figure 8:
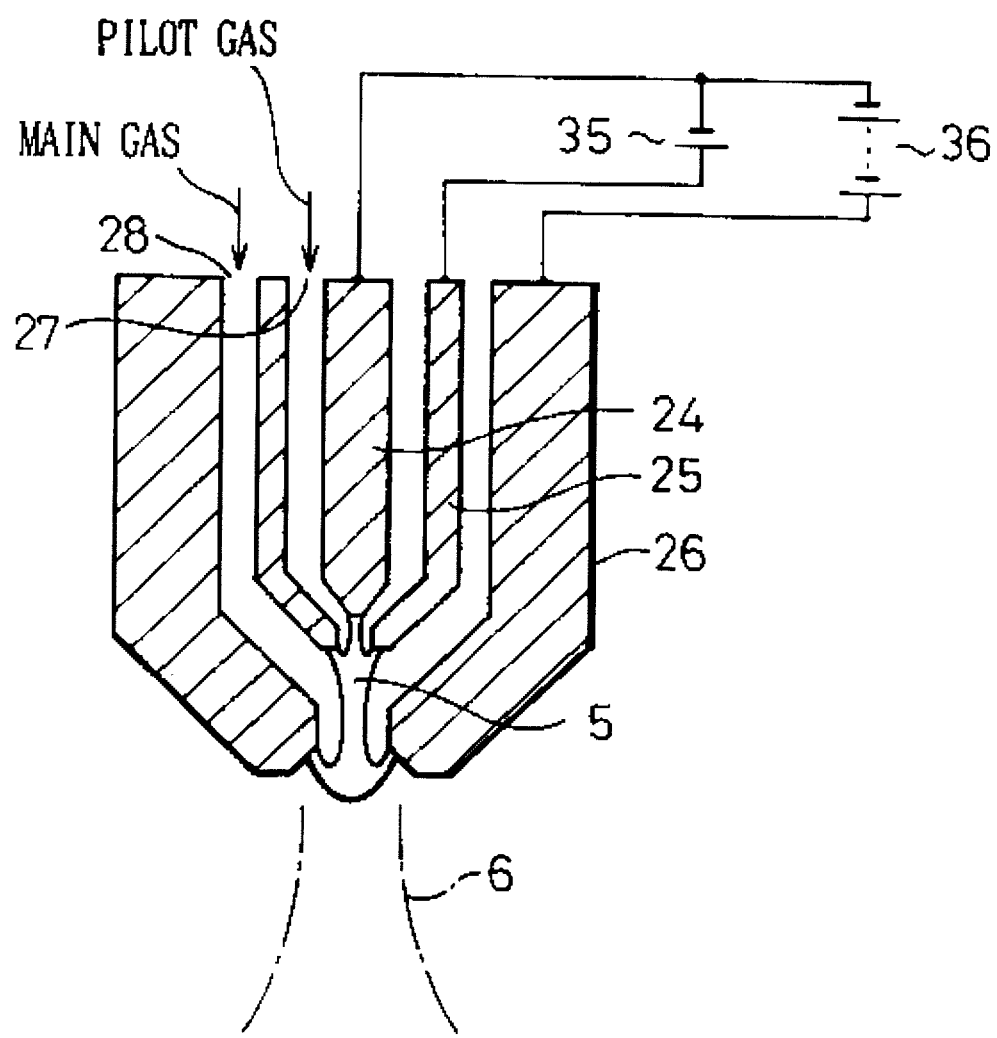
FIG. 8 is a side view (part 2) of a plasma torch for explaining the process for producing diamond according to Example 4 of the present invention.
Figure 24:
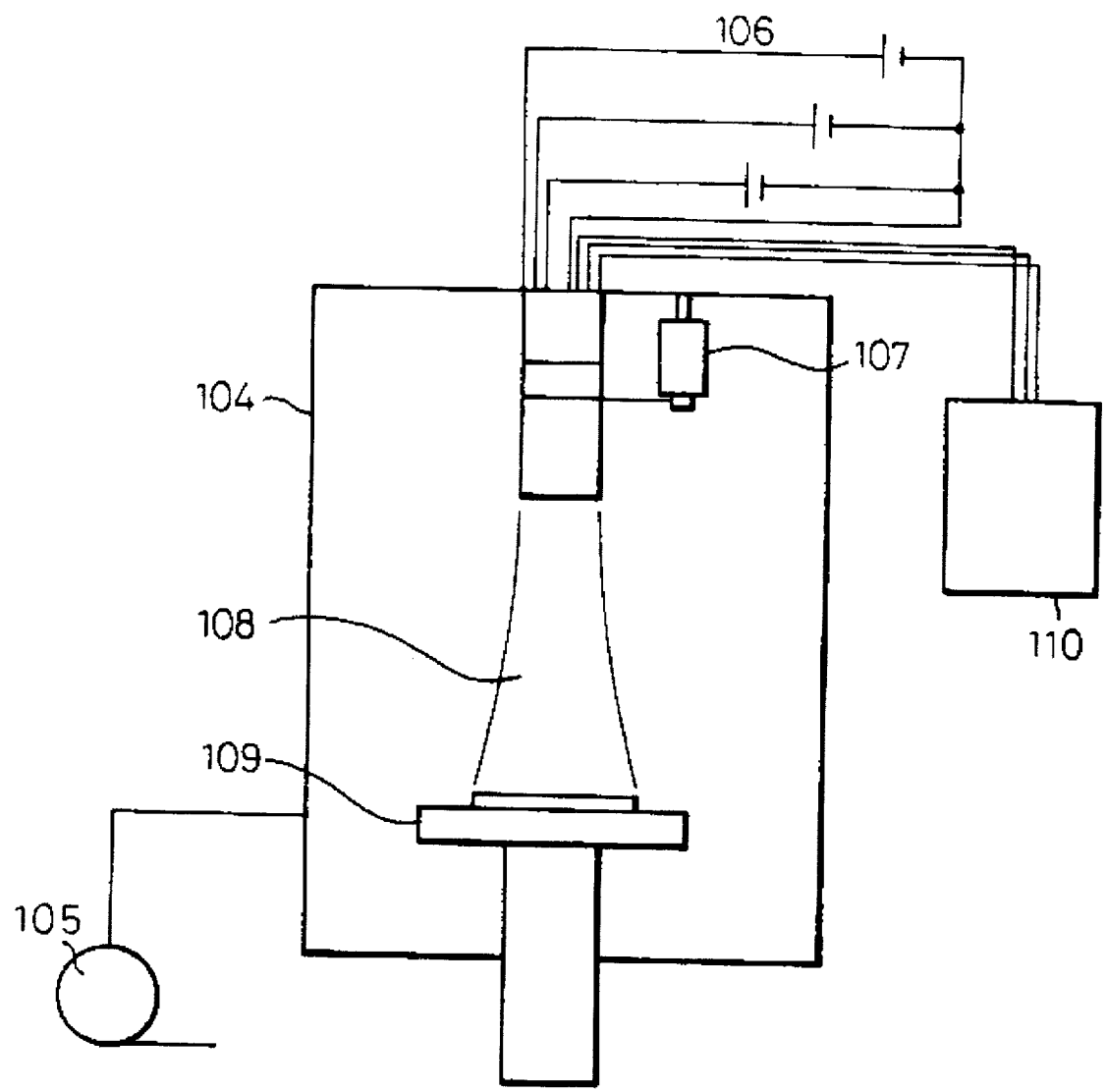
FIG. 24 is a schematic view of a diamond producing apparatus according to Example 15 of the present invention.

In FIG. 5 and FIG. 6, 24 is a columnar cathode with a pointed front end comprised of tungsten and/or copper, 30a and 30b are coolant piping which feed and drain coolant like cooling water to the cathode 24, and 31 is a cathode movement means which moves the cathode 24 up and down. For example, as shown in FIG. 7(a) and (b), during discharge, the cathode 24 may be moved along a common axis. Reference numeral 25 is a tubular pilot anode 25 which is provided concentrically with the cathode 24 and main anode 26 between the cathode 24 and main anode 26 and which assists the maintenance of the discharge state. It has formed in it a pilot gas introduction port 27 which introduces pilot gas to the clearance between the cathode 24 and the pilot anode 25. Reference numerals 32a and 32b are coolant piping which feed cooling water and other coolant to the pilot anode 25 and drain the same, while 33 is a pilot anode movement means which moves the pilot anode 25 up and down. As shown in FIG. 7(b) and FIG. 8, during the discharge, the pilot anode 25 may be moved along a common axis with the cathode 24.

Reference numeral 26 is a tubular main anode comprised of tungsten and/or copper and provided concentrically near the pilot anode 25. A main gas introduction port 28 is formed which introduces main gas to the clearance between the main anode 26 and the pilot anode 25. Further, the front end of the main anode 26 forms a plasma jetting port. Reference numerals 34a and 34b are coolant piping which feed cooling water or other coolants to the main anode 26 and drain the same. The cathode 24, the pilot anode 25, and the main anode 26 constitute the plasma torch. Reference numeral 29 is a gas introduction nozzle. Reference numeral 35 is an auxiliary power source. The pilot gas introduced to the clearance between the cathode 24 and the pilot anode 25 is converted to plasma by DC arc discharge. Reference numeral 19 is a main power source which is connected between the main anode 26 and the cathode 24. The main gas which is introduced to the clearance between the main anode 26 and the pilot anode 25 is converted to plasma by the DC arc discharge. Note that 19 is a substrate comprised of molybdenum (Mo) on which the diamond film is formed.

As explained above, according to the apparatus for producing diamond of Example 1 of the present invention, a pilot anode 25 is interposed concentrically in the clearance between the cathode 24 and the main anode 26, an auxiliary power source 35 is connected between the cathode 24 and the pilot anode 25, and a main power source 36 is connected independent of the auxiliary power source 35 between the cathode 24 and the main anode 26. Further, the apparatus is constructed so as to enable the cathode 24 and the pilot anode 25 to be moved along a common axis during discharge.

Therefore, first, the cathode 24 and the pilot anode 25 are brought into proximity to the jetting port of the main anode 26, voltage is applied across the cathode 24 and the pilot anode 25 so as to convert to plasma the pilot gas introduced to the clearance between the cathode 24 and the pilot anode 25, then the cathode 24 in proximity to the pilot anode 25 is moved away from the pilot anode 25 along the common axis to hold the discharge voltage between the cathode 24 and the pilot anode 25 at a predetermined voltage, then, voltage is applied across the cathode 24 and the main anode 26 so as to convert to plasma the main gas introduced to the clearance between the pilot anode 25 and the main anode 26, then while holding the discharge voltage between the cathode 24 and the pilot anode 25, the pilot anode 25 in proximity to the main anode 26 is moved away from the main anode 26 along the common axis so as to hold the discharge voltage between the cathode 24 and the main anode 26 to a predetermined voltage, whereby it is possible to jetting plasma to synthesize diamond in the state with the main arc 5 generated held constant.

As seen above, using the pilot arc generated in the clearance between the cathode 24 and the cathode 24, it is possible to prevent extinguishment of the main arc generated between the cathode 24 and the main anode 26 and control the discharge voltage between the cathode 24 and the main anode 26. In particular, by reducing the electrode distance between the cathode 24 and the main anode 26 when igniting the main arc and increasing the electrode distance between the cathode 24 and the main anode 26 after the main arc has been generated, it is possible to raise the discharge voltage between the cathode 24 and the main anode 26 much more than in the past in the state while holding the main arc 5. Due to this, it is possible to stably produce a high purity and high quality diamond film at a high speed and with a good reproducibility.

Note that in Example 1, as the location for introduction of the carbon compound gas, it is possible to use the main gas introduction port 28 at the clearance between the main anode 16 and the pilot anode 25, the gas introduction nozzle 29 placed near the jetting port of the plasma jet of the main anode 26, or the gas introduction port 16 formed in the chamber 15 wall. At this time, as with the diamond producing apparatus according to Example 2 shown in FIG. 9, it is possible to use the gas introduction nozzle 29 near the plasma jetting port of the main anode 26, or, as with the diamond producing apparatus according to Example 3 shown in FIG. 10, it is possible to introduce it from the gas introduction port 16 of the chamber 15 wall to the inside of the chamber 15. These may be used independently or may be used combined in any way. However, use of the pilot gas introduction port 27 at the clearance between the cathode 24 and the pilot anode 25 is not preferable from the viewpoint of the stability of the pilot arc.

Example 4

Next, an explanation will be made of a process for producing diamond of Example 4 of the present invention, wherein use is made of the diamond producing apparatus of Example 1 shown in FIG. 6, argon gas is introduced from the pilot gas introduction port 27, and a mixed gas of the methane gas (the feedstock gas), and hydrogen gas is introduced from the main gas introduction port 28, referring to FIG. 5, FIG. 6, FIG. 7(*a*) and (*b*), and FIG. 8.

First, the cathode 24 and the pilot anode 25 are set at the positions closest to the plasma jetting port of the main anode 26 (FIG. 7(*a*)) and a substrate 19 comprised of an Mo substrate of 50×50×5 mm size is set on a water-cooled substrate holder 18. Next, the inside of the chamber 15 is exhausted to lower the pressure to under 0.01 Torr, then 20 liters/minute of Ar gas is introduced to the clearance between the cathode 24 and the pilot anode 25 from the pilot gas introduction port 27 and 50 liters/minute of hydrogen gas and 1 liter/minute of methane gas are introduced to the clearance between the main anode 26 and the pilot anode 25 from the main gas introduction port 28.

Next, voltage is applied between the cathode and the pilot anode from the auxiliary power source 35 to cause generation of a pilot arc with a pilot current of 20A. The cathode 24 is moved away from the pilot anode 25 while maintaining the discharge state to make the pilot voltage 50 V (FIG. 7(*b*)). Next, voltage is applied between the cathode and the main anode from the main power source 36 to generate the main arc at a main arc current of 40A. The cathode 24 and the pilot anode 25 are slowly moved away from the main anode 26 while maintaining the discharge voltage to make the main arc voltage 200 V (FIG. 8). At this time, the overall discharge power is 9 kW.

Next, the pressure inside the chamber 15 is made 50 Torr and the XY stage 18 is brought close to the plasma torch so as to make the surface temperature of the substrate 19 raised by the plasma jet 1050° C. Next, by holding these conditions for one hour, a diamond film 37 is formed on the substrate 19. Note that to study the effects of Example 4 of the present invention, the changes in the arc voltage during formation of the diamond film 37 and the changes in the temperature of the substrate 19 were measured.

Further, the thus synthesized diamond was examined by a scanning type electron microscope (SEM) and the types of impurities and the concentration of the same were investigated by secondary ion mass spectrometry (SIMS). The results showed that the change in the main arc voltage was less than 2 percent and the change in the temperature of the substrate 19 was less than ±10° C. Further, the thickness of the synthesized diamond film 37 was 300 μm and the film-formation speed was 300 μm/hour. Further, the position from the center where the thickness of the diamond film 37 became 80 percent (240 μm) of that of the center portion was about 15 mm. Also, the results of the analysis of the impurities by SIMS showed that the concentrations of tungsten and/or copper, which are the electrode materials of the cathode 24 and the main anode 26, were under 0.1 ppm.

As explained above, according to the process of production of diamond of Example 4 of the present invention, first the cathode 24 and the pilot anode 25 are brought into close proximity to the plasma jetting port of the main anode 26 (FIG. 7(*a*)), a voltage is applied across the cathode 24 and the pilot anode 25 to convert to plasma the Ar gas introduced to the clearance between the cathode 24 and the pilot anode 25, then, while maintaining the discharge state, the cathode 24 in proximity to the pilot anode 25 is moved away from the pilot anode 25 (see FIG. 7(*b*)) to hold the discharge voltage between the cathode 24 and the pilot anode 25 at a predetermined voltage, then voltage is applied the cathode 24 and the main anode 26 so as to convert to plasma the main gas introduced to the clearance between the pilot anode 25 and the main anode 26, then, while maintaining the discharge state, the pilot anode 25 in proximity to the main anode 26 is (or the cathode 24 and the pilot anode 25 are) moved away from the main anode 26 to maintain the discharge voltage between the cathode 24 and the main anode 26 to a predetermined voltage, and plasma is jetted to synthesize diamond in a state while maintaining the main arc (FIG. 8).

By this, it is possible to use the pilot anode generated in the clearance between the cathode 24 and the pilot anode 25 to prevent extinguishment of the main arc between the cathode 24 and the main anode 26 and control the discharge voltage between the cathode 24 and the main anode 26. In particular, by reducing the electrode distance between the cathode 24 and the main anode 26 when igniting the main arc and increasing the electrode distance after the main arc has been generated, it is possible to raise the discharge voltage between the cathode 24 and the main anode 26 much more than in the past. Due to this, it is possible to stably produce a high purity and high quality diamond film 37 at a high speed and with a good reproducibility.

Note that as the pilot gas, use is made here of Ar gas, which gives a stable discharge, but the gas may also include He gas or other inert gases or hydrogen gas. Further, as the main gas, a gas mostly comprised of hydrogen gas, which plays an important role in the gas phase synthesis of diamond, is preferable, but Ar gas, He gas, or other inert gases may also be included. Further, as the method of feeding the methane gas serving as the feedstock of the diamond, the gas is mixed in the main gas introduced from the main gas introduction port 28 between the pilot anode 25 and the main anode 26, but it is also possible to use the method of blowing it into the plasma jet from the gas introduction nozzle 29 outside the main anode, as in the diamond producing apparatus according to Example 2 shown in FIG. 9, or feeding it as atmospheric gas from the gas introduction port 16, as in the diamond producing apparatus according to Example 3 shown in FIG. 10. However, the method of feeding it as pilot gas from the pilot gas introduction port 27 is not preferable since this reduces the stability of the pilot arc.

Example 5

Next, an explanation will be made of a process for producing diamond of Example 5 of the present invention, wherein use is made of the diamond producing apparatus of Example 2 shown in FIG. 9, methane gas is introduced as the feedstock gas from the gas introduction nozzle 29, Ar gas is introduced from the pilot gas introduction port 27, and hydrogen gas is introduced from the main gas introduction port 28, referring to FIG. 5, FIG. 7(a) and (b), FIG. 8, and FIG. 9.

First, the cathode 24 and the pilot anode 25 are set at the positions closest to the plasma discharge port of the main anode 26 (see FIG. 7(a)) and a substrate 19 comprised of an Mo substrate of 50×50×5 mm size is set on the substrate holder 18. Next, the inside of the chamber 15 is exhausted from an exhaust port 17 to lower the pressure to under 0.01 Torr, then 20 liters/minute of Ar gas is introduced to the clearance between the cathode 24 and the pilot anode 25 from the pilot gas introduction port 27 as the pilot gas and 50 liters/minute of hydrogen gas is introduced to the clearance between the main anode 26 and the pilot anode 25 from the main gas introduction port 28 as the main gas.

Next, a pilot arc is caused to be generated at a pilot current of 20A, the cathode 24 is slowly moved away from the pilot anode 25 while maintaining the pilot arc, the pilot voltage is raised to 50 V, and the discharge voltage is held (see FIG. 7(b)). Next, voltage is applied across the cathode 24 and the main anode 26 to generate the main arc at a main arc current of 40A, the pilot anode voltage is held at 50 V, and the pilot anode 25 is slowly moved away from the main anode 26, the voltage is raised to 200 V, then that discharge voltage is held (see FIG. 8). At this time, the overall discharge power is 9 kW.

Figure 9:
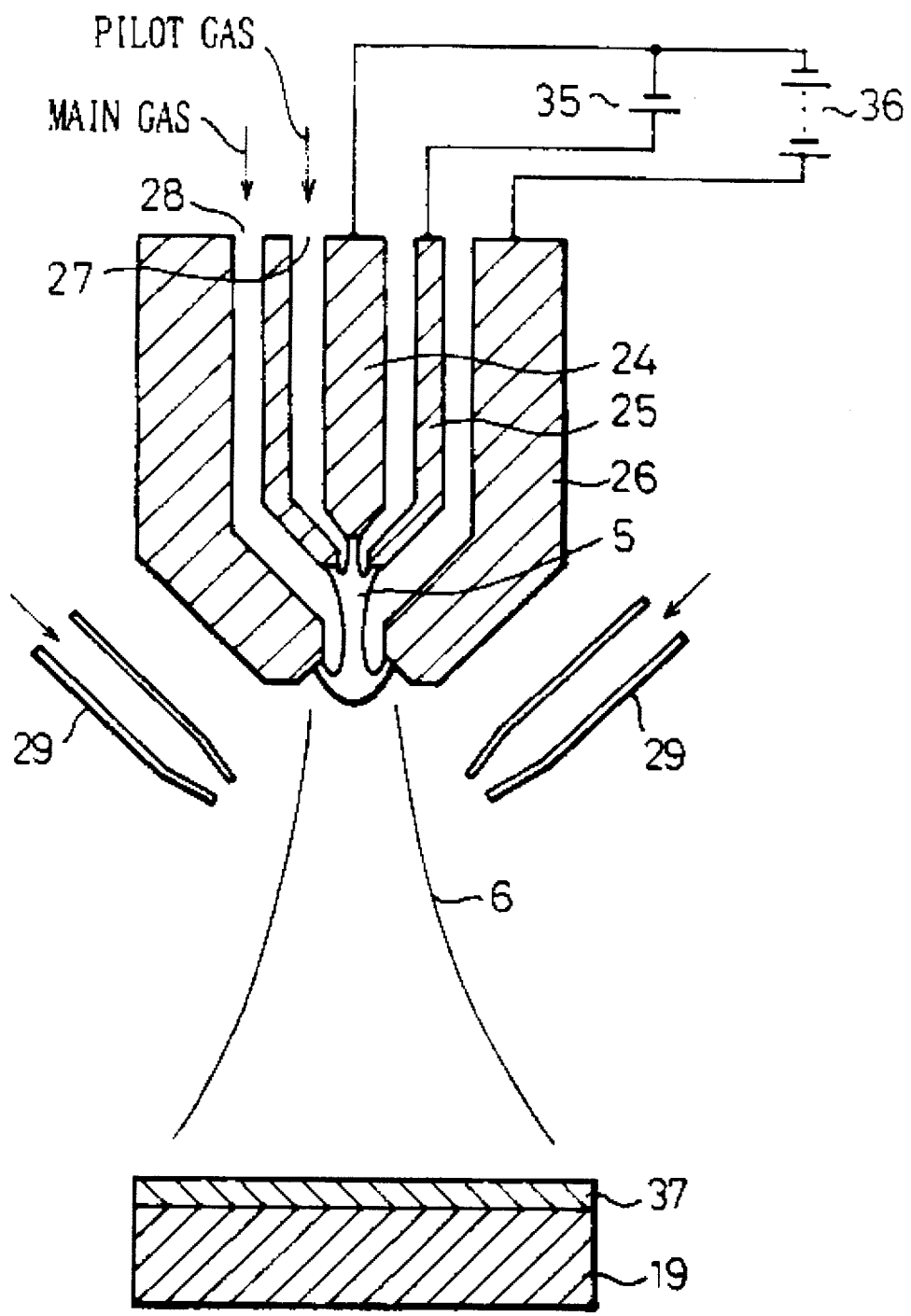
FIG. 9 is a structural view of a diamond producing apparatus according to Example 2 of the present invention.

Next, 2 liters/minute of methane gas is introduced as feedstock gas from the gas introduction nozzle 29 into the plasma jet 6 and mixed therewith (FIG. 9). By this, the methane gas is also converted to plasma. Next, the pressure inside the chamber 15 is made 50 Torr and the substrate 19 is brought close to the plasma torch to make the surface temperature of the substrate 1050° C.

Next, these conditions are held for one hour to form a diamond film 37 on the substrate 19 and the changes in the arc voltage and the changes in the substrate temperature are measured. Further, the synthesized diamond was examined by a scanning type electron microscope (SEM) and the concentration of impurities was examined by secondary ion mass spectrometry (SIMS). As a result, the change in the main arc voltage was less than 2 percent and the change in the temperature of the substrate 19 was less than ±10° C. The thickness of the synthesized diamond film 37 was 350 μm and the film-formation speed was 350 μm/hour. Further, the position from the center where the thickness of the synthesized diamond film 37 became 80 percent (280 μm) of that of the center portion was about 15 mm. Also, the results of the analysis of the impurities by SIMS showed that the concentrations of tungsten and/or copper, which are the electrode materials, were under 0.1 ppm.

As explained above, according to the process of production of diamond of Example 5 of the present invention, methane gas is introduced as feedstock gas from the gas introduction nozzle 29 outside of the main anode 26 into the plasma jet from the plasma torch and mixed with the same. By this as well, like with Example 4, it is possible to raise the discharge voltage between the cathode 24 and the main anode 26 much more than in the past while maintaining the main arc and it is possible to stably produce a high purity and high quality diamond film 37 at a high speed and with a good reproducibility.

Example 6

Figure 10:
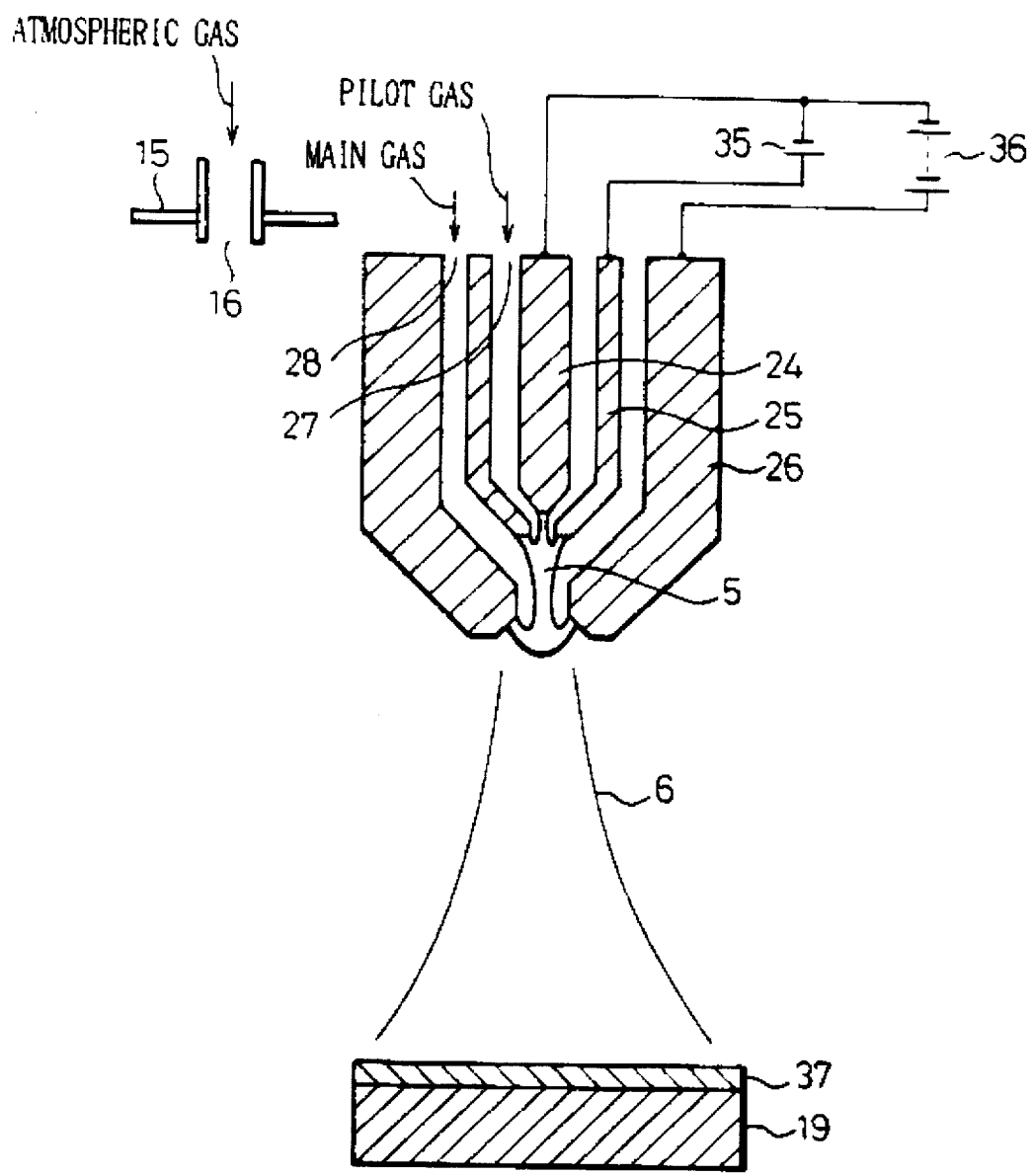
FIG. 10 is a structural view of a diamond producing apparatus according to Example 3 of the present invention.

Next, an explanation will be made of a process for producing diamond of Example 6 of the present invention, wherein use is made of the diamond producing apparatus of Example 3 shown in FIG. 5 and FIG. 10, methane gas is introduced as the feedstock gas from the gas introduction port 16 in the chamber 15 wall, argon gas is introduced from the pilot gas introduction port 27, and hydrogen gas is introduced from the main gas introduction port 28, referring to FIG. 5, FIG. 7(a) and (b), FIG. 8, and FIG. 10.

First, the cathode 24 and the pilot anode 25 are set at the positions closest to the plasma jetting port of the main anode 26 (see FIG. 7(a)) and a substrate 19 comprised of an Mo substrate of 50×50×5 mm size is set on the substrate holder 18.

Next, the inside of the chamber 15 is exhausted to lower the pressure to under 0.01 Torr, then 20 liters/minute of Ar gas is introduced to the clearance between the cathode 24 and the pilot anode 25 from the pilot gas introduction port 27 as the pilot gas and 50 liters/minute of hydrogen gas is introduced to the clearance between the main anode 26 and the pilot anode 25 from the main gas introduction port 28 as the main gas. Next, voltage is applied between the cathode 24 and the pilot anode 25 to generate a pilot arc at a pilot current of 20A, the cathode 24 is slowly moved away from the pilot anode 25 while maintaining the pilot arc, and the pilot voltage is raised to 50 V (see FIG. 7(b)).

Next, voltage is applied across the cathode 24 and the main anode 26 to generate the main arc at a main arc current of 40A, the cathode 24 and the pilot anode 25 are slowly moved away from the main anode 26 while maintaining the main arc, and the main arc voltage is made 200 V (see FIG. 8). At this time, the overall discharge power becomes 9 kW. In this case, the cathode 24 and the pilot anode 25 are moved away from the main anode 26; the point is to control the distances between the electrode 24, 25 and 26 by the electrode movement mechanism 40 in FIG. 12. So, it is needles to say that the main anode 26 may be moved away from pilot anode 25 or the cathode 24. Next, 2 liters/minute of methane gas is introduced from the gas introduction port 16 in FIG. 10 into the chamber 15. By this, the methane gas is mixed in the discharged plasma jet 6, converted to plasma, and fed to the substrate 19.

Next, the pressure inside the chamber 15 is made 100 Torr and the substrate 19 is brought close to the plasma torch to make the surface temperature of the substrate 1050° C. Next, these conditions are held for one hour to form a diamond film 37 on the substrate 19 and the changes in the arc voltage and the changes in the substrate temperature are measured.

Further, the synthesized diamond was examined by a scanning type electron microscope (SEM) and the concentration of impurities was examined by secondary ion mass spectrometry (SIMS).

According to the results of the examination, the change in the main arc voltage was less than 2 percent and the change in the temperature of the substrate 19 was less than ±10° C. The thickness of the synthesized diamond film 37 was 300 μm and the film-formation speed was 300 μm/hour. Further, the position from the center where the thickness of the synthesized diamond film 37 became 80 percent (240 μm) of that of the center portion was about 15 mm. Also, the results of the analysis of the impurities by SIMS showed that the concentrations of tungsten and copper, which are the electrode materials, were under 0.1 ppm.

As explained above, according to the process of production of diamond of Example 6 of the present invention, methane gas is introduced as feedstock gas from the gas introduction port 16 of the chamber 15 wall into the chamber 15 and converted to plasma. By this as well, like with Example 4, it is possible to raise the discharge voltage between the cathode 24 and the main anode 26 much more than in the past while maintaining the main arc and it is possible to stably produce a high purity and high quality diamond film 37 at a high speed and with a good reproducibility.

Example 7

Next, an explanation will be made of a process for producing diamond of Example 7 of the present invention, wherein use is made of the diamond producing apparatus of Example 3 shown in FIG. 5 and FIG. 10, methane gas and oxygen gas are introduced from the gas introduction port 16 in the chamber 15 wall, argon gas is introduced from the pilot gas introduction port 27, and hydrogen gas is introduced from the main gas introduction port 28, referring to FIG. 5, FIG. 7($a$) and ($b$), FIG. 8, and FIG. 10.

First, the cathode 24 and the pilot anode 25 are set at the positions closest to the plasma jetting port of the main anode 26 (see FIG. 7($a$)) and a substrate 19 comprised of an Mo substrate of 50×50×5 mm size is set on the substrate holder 19. Next, the inside of the chamber 15 is exhausted to lower the pressure to under 0.01 Torr, then 20 liters/minute of Ar gas is introduced from the pilot gas introduction port 27 as the pilot gas and 50 liters/minute of hydrogen gas is introduced from the main gas introduction port 28 as the main gas into the pilot gas introduction port 27 of the plasma torch and the main gas introduction port 28, respectively.

Next, a pilot arc is generated at a pilot current of 20A, the cathode 24 is slowly moved away from the pilot anode 25 while maintaining the pilot arc, and the pilot voltage is raised to 50 V (see FIG. 7($b$)). Next, the main arc is generated at a main arc current of 40A, then the cathode 24 and the pilot anode 25 are slowly moved away from the main anode 26 while maintaining the main arc, and the main arc voltage is made 200 V (see FIG. 8). At this time, the overall discharge power becomes 9 kW. In FIG. 8 the distance between the cathode 24 and the pilot anode 25 is maintained nearly equal to that of FIG. 7($b$), on the other hand the distance between the pilot anode 25 and the main anode 26 is increased than that of FIG. 7($b$).

Next, a mixed gas comprising 3 liters/minute of methane gas and 0.5 liter/minute of oxygen gas is introduced from the gas introduction port 16 into the chamber 15. By this, the methane gas and oxygen gas are mixed in the plasma jet 6, converted to plasma. Next, the pressure inside the chamber 15 is made 50 Torr and the substrate 19 is brought close to the plasma torch to make the surface temperature of the substrate 1050° C.

Next, these conditions are held for one hour to form a diamond film 37. At this time, the changes in the arc voltage and the changes in the substrate temperature during the synthesis of the diamond film 37 were measured. Further, the synthesized diamond was examined by a scanning type electron microscope (SEM) and the concentration of impurities was examined by secondary ion mass spectrometry (SIMS).

According to the results, the change in the main arc voltage was less than 2 percent and the change in the temperature of the substrate 19 was less than ±10° C. The thickness of the synthesized diamond film 37 was 300 µm and the film-formation speed was 300 µm/hour. Further, the position from the center where the thickness of the synthesized diamond film 37 became 80 percent (240 µm) of that of the center portion was about 20 mm. Also, the results of the analysis of the impurities by SIMS showed that the concentrations of tungsten and/or copper, which are the electrode materials, were under 0.1 ppm.

As explained above, according to the process of production of diamond of Example 7 of the present invention, a mixed gas of methane gas as the feedstock gas and oxygen gas as the oxidizing gas is introduced from the gas introduction port 16 of the chamber 15 wall into the chamber 15 and converted to plasma. However, the addition of the oxidizing gas enables the quality of the diamond film 37 to be further improved. By this, like with Example 4, it is possible to raise the discharge voltage between the cathode 24 and the main anode 26 much more than in the past while maintaining the main arc and it is possible to stably produce a high purity and high quality diamond film 37 at a high speed and with a good reproducibility.

Note that in Example 7, use was made of oxygen gas as the oxidizing gas, but it is also possible to use steam or other oxidizing gases, halogen gas, halogenated hydrogen gas, etc. instead of oxygen gas.

Comparative Example 1

Next, an explanation will be given of the process for producing diamond using a diamond producing apparatus of the prior art shown in FIG. 1 while referring to FIG. 1.

First, a substrate 7 comprised of an Mo substrate of 50×50×5 mm is held on an XY stage. Next, the inside of the chamber is exhausted to reduce the pressure to under 0.01 Torr, then 20 liters/minute of Ar gas, 50 liters/minute of hydrogen gas, and 1 liter/minute of methane gas are introduced as plasma gas to the clearance between the columnar cathode 1 with the sharp front end and the tubular anode 2 provided concentrically near the cathode 1.

Next, the pressure inside the chamber is held at 50 Torr and an arc generated with an arc current of 90A and an arc voltage of 100 V, then the XY stage is brought close to the plasma torch to make the surface temperature of the substrate 1050° C.

Next, these conditions are held for one hour to synthesize the diamond film 8 and the changes in the arc voltage and the changes in the temperature of the substrate on which the film is formed were measured. Further, the synthesized diamond was examined by a scanning type electron microscope (SEM) and the concentration of impurities was examined by secondary ion mass spectrometry (SIMS).

The results showed that the change in the arc voltage was about 5 percent and the change in the temperature of the substrate 7 was ±30° C. Further, the thickness of the synthesized diamond film 8 was 200 µm and the film-formation speed was 200 µm/hour. Further, the position from the center where the thickness of the synthesized diamond film 8 became 80 percent (160 µm) of that of the center portion was about 10 mm. Also, the results of the analysis of the impurities by SIMS showed that the concentrations of tungsten and/or copper, which are the electrode materials, were several ppm.

As explained above, according to the Comparative Example 1, the film-forming speed is slower compared with all of the examples and the uniformity of the thickness of the diamond film 8 synthesized in the substrate was inferior.

Comparative Example 2

An explanation will be made of the process for production of diamond according to Comparative Example 2, where use is made of the improved diamond producing apparatus of the prior art shown in FIG. 11 and the cathode is moved to adjust the discharge voltage, referring to FIG. 11. The difference from Comparative Example 1 is that it is possible to move the cathode 1 along a common axis. Further, the arc current is made a low 40A and the discharge voltage is raised to 200 V.

First, the columnar cathode 1 with the sharp front end is set to the position closest to the plasma discharge port of the tubular anode 2 provided concentrically near the cathode 1 and a substrate comprised of Mo of 50×50×5 mm size is placed on the XY stage.

Next, the inside of the chamber is exhausted to reduce the pressure to less than 0.01 Torr, then 20 liters/minute of Ar gas, 50 liters/minute of hydrogen gas, and 1 liter/minute of methane gas are introduced as plasma gas to the gas introduction port 3 of the clearance between the cathode 1 and the anode 2.

Next, the pressure inside the chamber was held to 50 Torr and voltage was supplied from the power source 4 connected between the cathode 1 and the anode 2 to pass an arc current of 40A and generate an arc column 5 between the cathode 1 and the anode 2. An attempt was made to slowly move the cathode 1 away from the anode 2 while the arc was maintained and raise the discharge voltage to 200 V. As a result, 200 V was able to be realized, but this stopped in a few minutes and therefore a stable discharge could not be obtained.

As explained above, according to the diamond producing apparatus of the present invention, a pilot anode was interposed in the clearance between the cathode and the main anode, a main power source was connected between the cathode and the main anode, an auxiliary power source was connected between the cathode and pilot anode, and the cathode and pilot anode were made able to move along a common axis during the discharge.

Therefore, as in the process of production of diamond of the present invention, a plurality of anodes are provided, the discharge is first performed between the cathode and the pilot anode to form plasma, whereby pilot arc is generated, and, if necessary, the cathode is moved away from the pilot anode, the discharge voltage is maintained at a predetermined voltage, then the main arc is generated between the cathode and the main anode and thereafter the cathode and/or the pilot anode in proximity to the main anode are/is moved away from the main anode while maintaining the discharge state, the discharge voltage between the cathode and the main anode is held to a predetermined voltage, and the plasma is jetted to synthesize diamond.

By this, using the pilot arc generated in the clearance between the cathode and the pilot anode, it is possible to prevent extinguishment of the main arc between the cathode and the main anode and to considerably raise the discharge voltage between the cathode and the main anode compared with the past.

Due to this, it is possible to stably produce high purity and high quality diamond at a high speed with a good reproducibility.

Example 8

Figure 12:
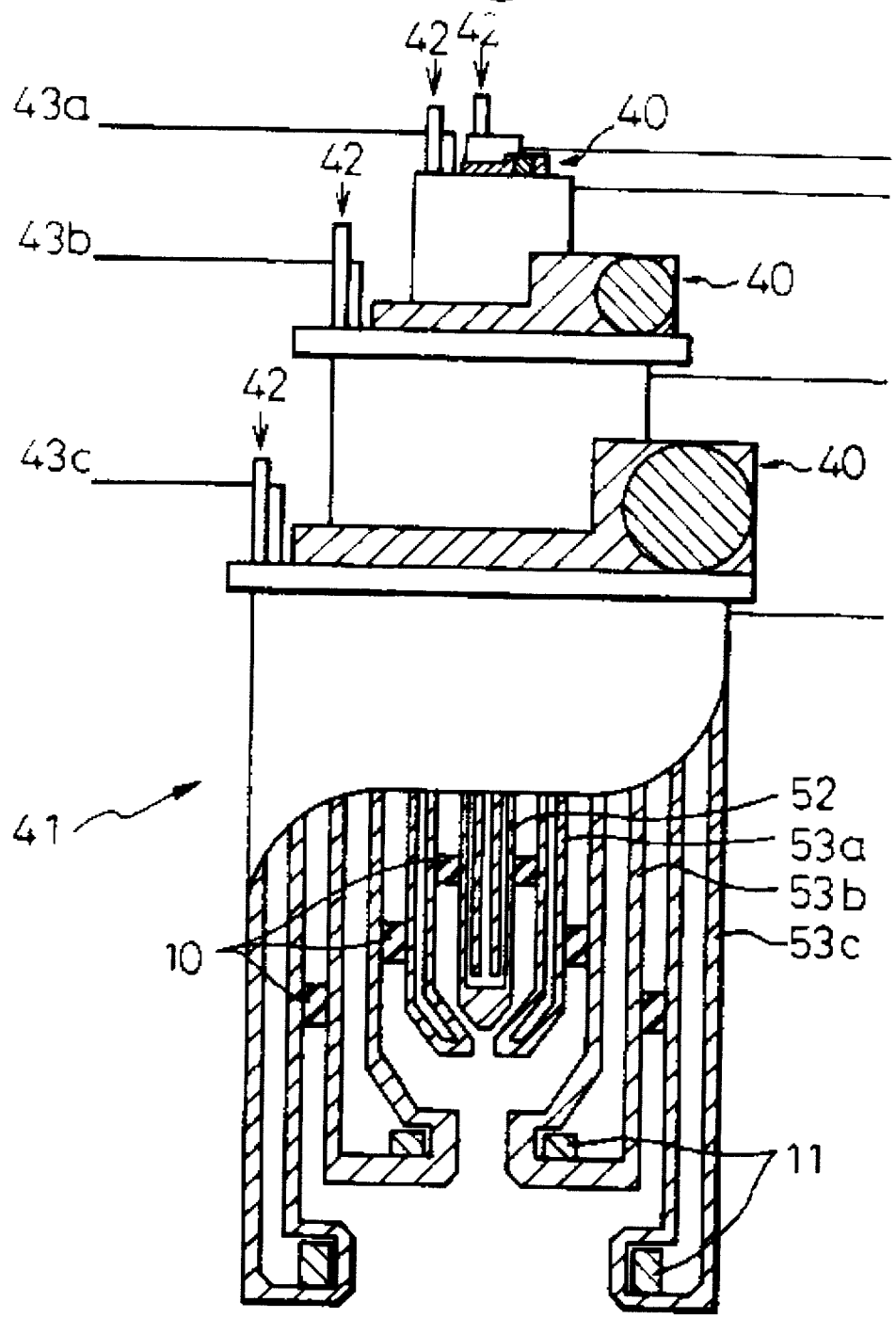
FIG. 12 is a structural view of a diamond producing apparatus according to Example 8 of the present invention.
Figure 13:
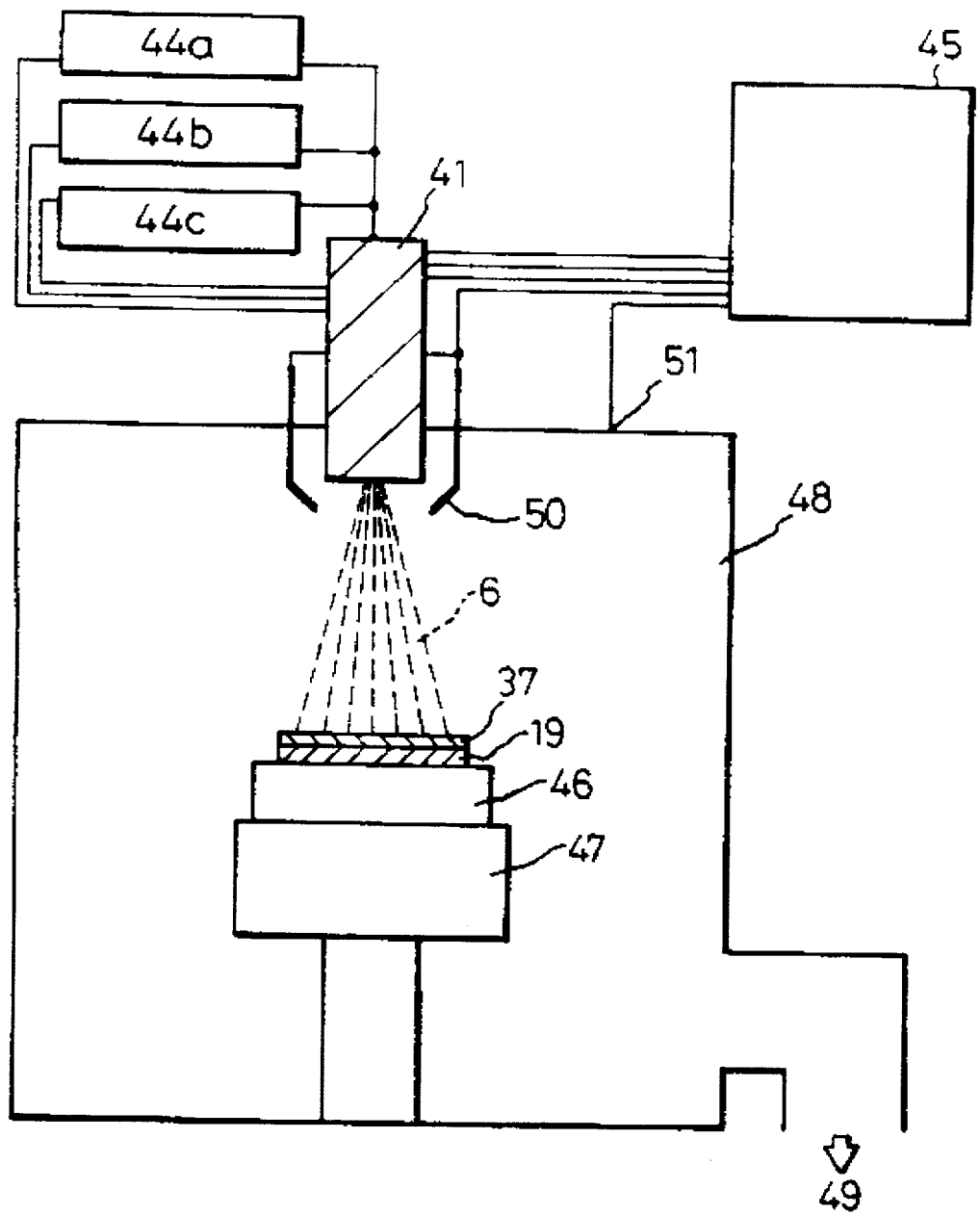
FIG. 13 is a structural view of a diamond producing apparatus according to Example 8 of the present invention.

FIG. 12 and FIG. 13 are schematic views of a three-clad anode type plasma torch and a diamond synthesizing apparatus using this torch. In the figures, 40 is an electrode movement mechanism, 41 is a plasma torch, 42 is cooling water, 43a is first gas, 43b is second gas, 43c is third gas, 44a is a first power source, 44b is a second power source, 44c is a third power source, 45 is a gas feed system, 46 is a substrate holder, 47 is a manipulator, 48 is a chamber, 49 is an exhaust system, 50 is a feedstock gas introduction nozzle, and 51 is an atmospheric gas introduction port. This torch is constructed so that the cathode 52 and the first anode 53, the second anode 54, and the third anode 53c can be moved during the generation of the plasma jet.

Diamond was synthesized using this apparatus by the following method.

1) The electrodes 52, 53a, 53b and 53c were placed at positions closest together and a 100×100×5 mm Mo substrate 19 was attached to a water-cooled substrate holder 46.

2) The inside of the chamber was exhausted to less than 0.01 Torr, then 10 liters/minute of Ar was introduced as the first gas, 20 liters/minute of hydrogen and 0.6 liter/minute of methane were introduced as the second gas, and 10 liters/minute of hydrogen was introduced as the third gas.

3) First, discharge was caused by applying a voltage across the cathode 52 and the first anode 53a from the first power source 44a with a first anode current of 20A and the cathode 52 was slowly lifted (i.e., moved away from the first anode 53a) to make the first anode voltage 50 V.

4) Next, discharge was caused by applying a voltage between the cathode 52 and the second anode 53b from the second power source 44b with a second anode current of 40A and the cathode 52 and first anode 53a were slowly lifted (i.e., moved away from the second anode 53b) to make the second anode voltage 200 V.

5) Next, discharge was caused by applying a voltage between the cathode 52 and the third anode 53c from the third power source 44c with a third anode current of 30A and the cathode 52, the first anode 53a, and the second anode 53b were slowly lifted (i.e., moved away from the third anode 53c) to make the third anode voltage 300 V. The overall discharge output became 18 kW.

6) The pressure inside the chamber was made 50 Torr and the substrate holder was brought close to the torch to make the substrate surface temperature 1000° C.

7) The diamond was synthesized under these conditions for one hour and the changes in the substrate temperature were measured.

8) The synthesized diamond was examined by a scanning type electron microscope (SEM), the quality of the diamond was evaluated by X-ray diffraction and Raman spectroscopy, and the concentration of impurities was analyzed by secondary ion mass spectrometry (SIMS).

As a result, the change in the substrate temperature was less than ±10° C. The thickness of the synthesized diamond film was 400 µm, while the film-forming speed was 400 µm/hr. Further, the distance from the center where the thickness became 80 percent (320 µm) of that of the center portion was about 20 mm. In the X-ray diffraction, only the diamond peak was detected, while with the Raman spectroscopy, only the diamond peak of 1333 cm$^{-1}$ was detected. No graphite or amorphous carbon were detected. Further, the results of the analysis by SIMS showed that the concentrations of tungsten and copper, which are the electrode materials, were under 0.1 ppm.

Example 9

Diamond was synthesized by the following process using the torch of FIG. 12 and the diamond synthesizing apparatus of FIG. 13 in the same way as Example 8.

1) The electrodes 52, 53a, 53b and 53c were placed at positions closest together and a 100×100×5 mm Mo, substrate was attached to a water-cooled substrate holder.

2) The inside of the chamber was exhausted to less than 0.01 Torr, then 10 liters/minute of Ar was introduced as the first gas, 20 liters/minute of hydrogen was introduced as the second gas, and 10 liters/minute of hydrogen was introduced as the third gas.

3) First, discharge was caused by applying a voltage between the cathode 52 and the first anode 53a with a first anode current of 20A and the cathode 52 was slowly lifted (i.e., moved away from the first anode 53a) to make the first anode voltage 50 V.

4) Next, discharge was caused by applying a voltage between the cathode 52 and the second anode 53b with a second anode current of 40A and the cathode 52 and first anode 53a were slowly lifted (i.e., moved away from the second anode 53b) to make the second anode voltage 200 V.

5) Next, discharge was caused by applying a voltage between the cathode 52 and the third anode 53c with a third anode current of 30A and the cathode 52, the first anode 53a, and the second anode 53b were slowly lifted (i.e., moved away from the third anode 53c) to make the third anode voltage 300 V. The overall discharge output became 18 kW.

6) 0.6 liter/minute of methane was introduced from the feedstock gas introduction nozzle (50), the pressure inside the chamber was made 50 Torr, and the substrate holder 46 was brought close to the torch to make the substrate surface temperature 1000° C.

7) The diamond was synthesized under these conditions for one hour and the changes in the substrate temperature were measured.

8) The synthesized diamond was examined by a scanning type electron microscope (SEM), and the concentration of impurities was analyzed by secondary ion mass spectrometry (SIMS).

As a result, the change in the substrate temperature was less than ±10° C. The thickness of the synthesized diamond film was 400 μm and the film-forming speed was 400 μm/hour. Further, the distance from the center where the thickness became 80 percent (320 μm) of that of the center portion was about 25 mm. In the X-ray diffraction, only the diamond peak was detected, while with Raman spectroscopy, only the diamond peak of 1333 cm$^{-1}$ was detected. No graphite or amorphous carbon were detected. Further, the results of the analysis by SIMS showed that the concentrations of tungsten and copper, which are the electrode materials, were under 0.1 ppm.

Example 10

Diamond was synthesized by the following process using the torch of FIG. 12 and the diamond synthesizing apparatus of FIG. 13 in the same way as Example 8.

1) The electrodes 52, 53a, 53b and 53c were placed at their respective closest positions and a 100×100×5 mm Mo substrate was attached to a water-cooled substrate holder.

2) The inside of the chamber was exhausted to less than 0.01 Torr, then 10 liters/minute of Ar was introduced as the first gas, 20 liters/minute of hydrogen was introduced as the second gas, and 10 liters/minute of hydrogen was introduced as the third gas.

3) First, discharge was caused with a first anode current of 20A and the cathode 52 was slowly lifted (i.e., moved away from the fixed anode) to make the first anode voltage 50 V.

4) Next, discharge was caused with a second anode current of 40A and the cathode 52 and the first anode 53a were slowly lifted (i.e., moved away from the fixed anode) to make the second anode voltage 200 V.

5) Next, discharge was caused with a third anode current of 30A and the cathode the first anode 53a and second anode 53b were slowly lifted (i.e., moved away from the fixed anode) to make the third anode voltage 300 V. The overall discharge output became 18 kW.

6) 0.6 liter/minute of methane was introduced from the atmospheric gas introduction port 51, the pressure inside the chamber was made 50 Torr, and the substrate holder was brought close to the torch to make the substrate surface temperature 1000° C.

7) Diamond was synthesized under these conditions for one hour and the changes in the substrate temperature were measured.

8) The synthesized diamond was examined by a scanning type electron microscope (SEM), and the concentration of impurities was analyzed by secondary ion mass spectrometry (SIMS).

As a result, the change in the substrate temperature was less than ±10° C. The thickness of the synthesized diamond film was 350 μm and the film-forming speed was 350 μm/hour. Further, the distance from the center where the thickness became 80 percent (280 μm) of that of the center portion was about 30 mm. In the X-ray diffraction, only the diamond peak was detected, while with Raman spectroscopy, only the diamond peak of 1333 cm$^{-1}$ was detected. No graphite or amorphous carbon were detected. Further, the results of the analysis by SIMS showed that the concentrations of tungsten and copper, which are the electrode materials, were under 0.1 ppm.

Example 11

Figure 14:
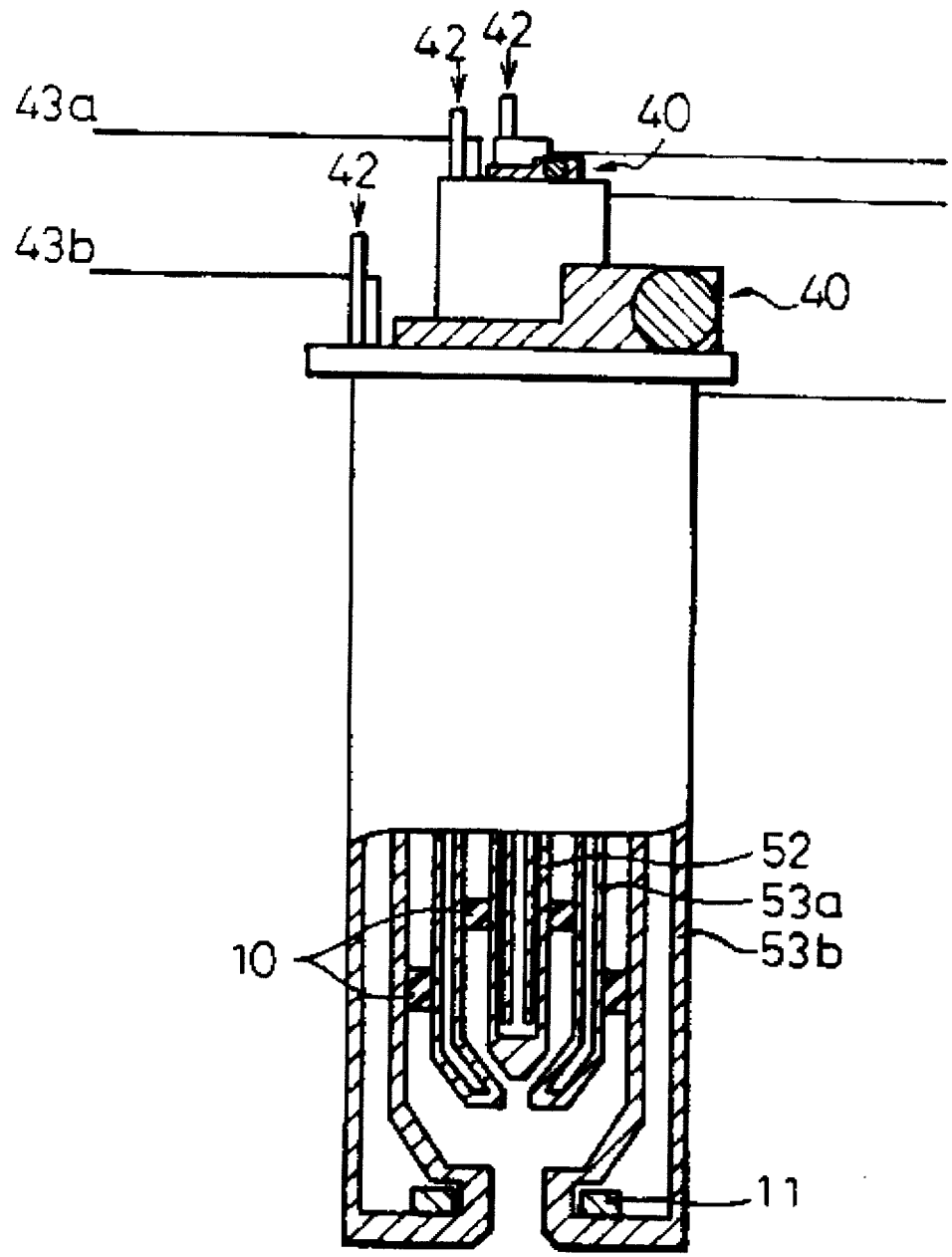
FIG. 14 is a structural view of a diamond producing apparatus according to Example 11 of the present invention.

FIG. 14 and FIG. 15 are schematic views of two-clad anode type plasma torch arranged coaxially in a telescoped structure and a diamond synthesis apparatus using that torch. Diamond was synthesized by the following process using the apparatus.

1) A 100×100×5 mm Mo substrate was attached to a water-cooled substrate holder.

2) The inside of the chamber 48 was exhausted to less than 0.01 Torr, then 10 liters/minute of Ar was introduced as the first gas and 20 liters/minute of hydrogen and 0.6 liter/minute of methane were introduced as the second gas.

3) First, discharge was caused by applying a voltage between the cathode 52 and the first anode 53a from the first power source 4 with a first anode current of 20A. The discharge voltage at that time was 40 V.

4) Next, discharge was caused by applying a voltage between the cathode 52 and the second anode 53b from the second power source 4 with a second anode current of 40A. The discharge voltage at that time was 180 V. The overall discharge output became 8 kW.

5) The pressure inside the chamber was made 50 Torr, and the substrate holder 46 was brought close to the torch 41 to make the substrate surface temperature 1000° C.

6) Diamond was synthesized under these conditions for one hour and the changes in the substrate temperature were measured.

7) The synthesized diamond was examined by a scanning type electron microscope (SEM), the quality of the diamond was evaluated by X-ray diffraction and Raman spectroscopy, and the concentration of impurities was analyzed by secondary ion mass spectrometry (SIMS).

As a result, the change in the substrate temperature was less than ±10° C. The thickness of the synthesized diamond film was 400 µm and the film-forming speed was 400 µm/hour. Further, the distance from the center where the thickness became 80 percent (320 µm) of that of the center portion was about 8 mm. In the X-ray diffraction, only the diamond peak was detected, while with Raman spectrometry, only the diamond peak of 1333 cm$^{-1}$ was detected. No graphite or amorphous carbon were detected. Further, the results of the analysis by SIMS showed that the concentrations of tungsten and/or copper, which are the electrode materials, were under 0.1 ppm.

Comparative Example 3

Using the torch of the conventional construction shown in FIG. 1, diamond was synthesized for one hour with 20 liters/minute of Ar, 20 liters/minute of hydrogen, and 0.4 liter/minute of methane as the plasma gas, an arc current of 90A, arc voltage of 100 V, a chamber pressure of 50 Torr, and a substrate surface temperature of 1000° C.

As a result, the change in the substrate temperature was +30° C. the thickness of the diamond film was 200 µm, and the distance where the thickness became 80 percent (160 µm) of the center portion was about 8 mm. Further, the results of the analysis by SIMS detected tungsten and/or copper in several ppm.

Comparative Example 4

Figure 11A:
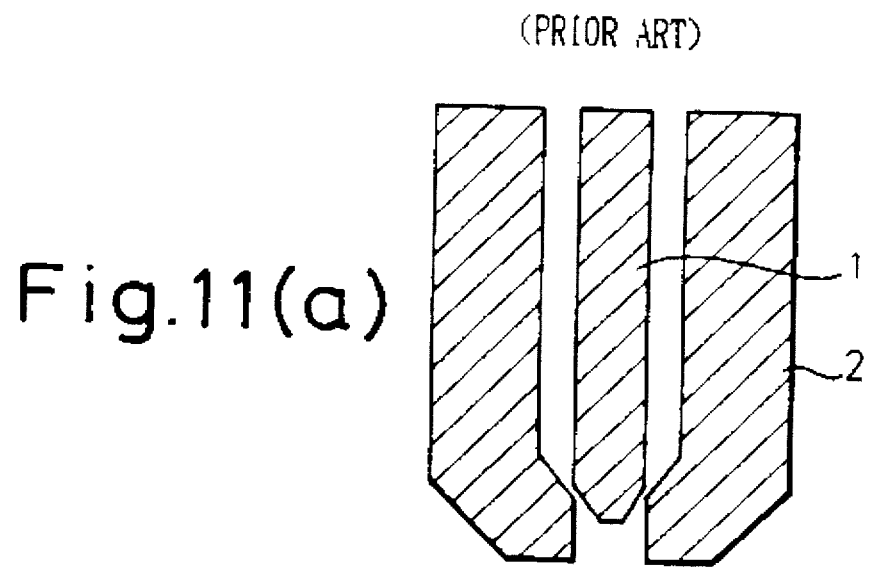
FIGS. 11(a) and 11(b) are side views of a plasma torch for explaining Comparative Example 2 for the diamond producing apparatus according to the present invention.
Figure 11B:
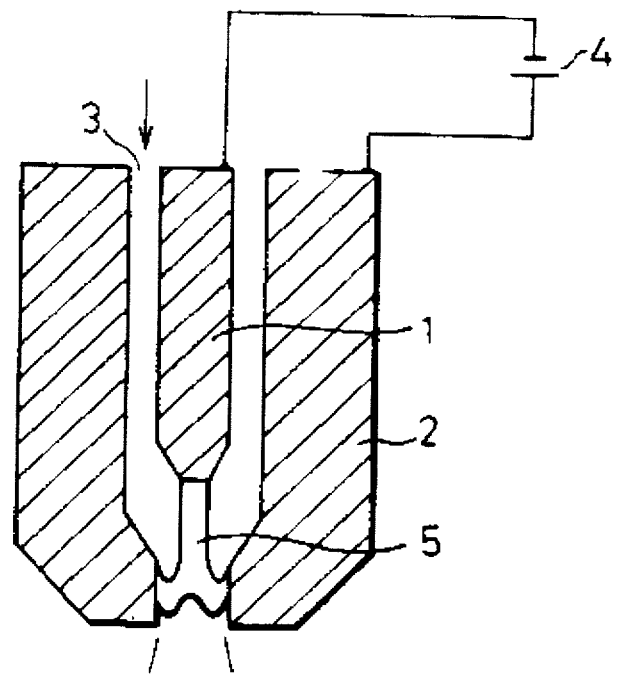

Using the conventional torch of the construction shown in FIG. 11, introducing 20 liters/minute of Ar and 20 liters/minute of hydrogen, and using discharge current of 40A, it was attempted to raise the discharge voltage to 200 V by slowly moving the cathode away from the anode. As a result, 200 V could be achieved, but the discharge stopped after several minutes and therefore a stable discharge could not be obtained.

As explained above, by using the torch of the multiclad anode of the present invention, the stability of the discharge is increased, the controllability of the substrate temperature and other synthesis conditions was improved, and the reproducibility and reliability of the synthesis were improved. Further, the consumption of the electrodes was reduced and the purity of the diamond increased. Also, the speed of synthesis was raised and the area of film formation was enlarged.

Example 12

Figure 16:
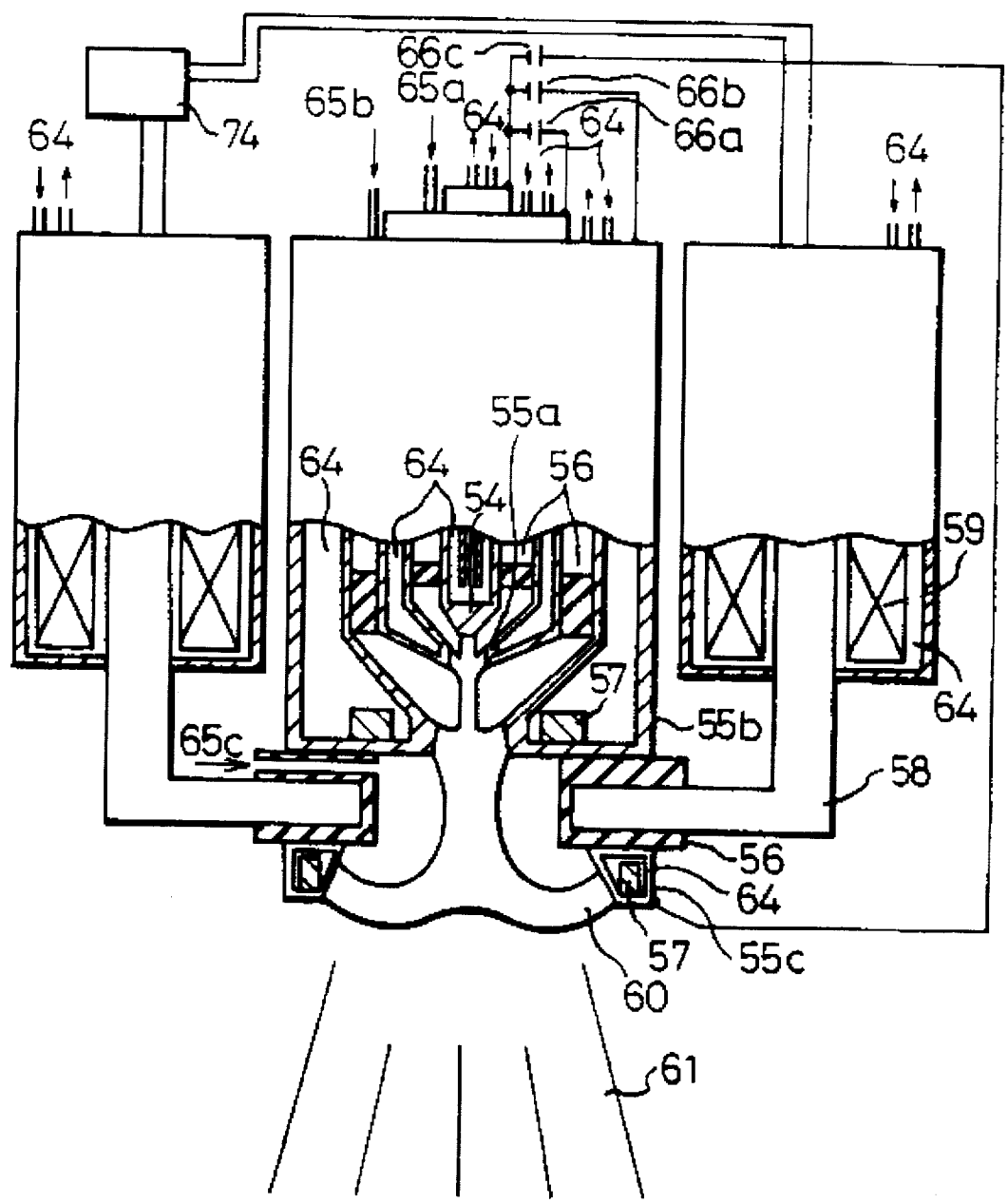
FIG. 16 is a structural view of a diamond producing apparatus according to Example 12 of the present invention.
Figure 17:
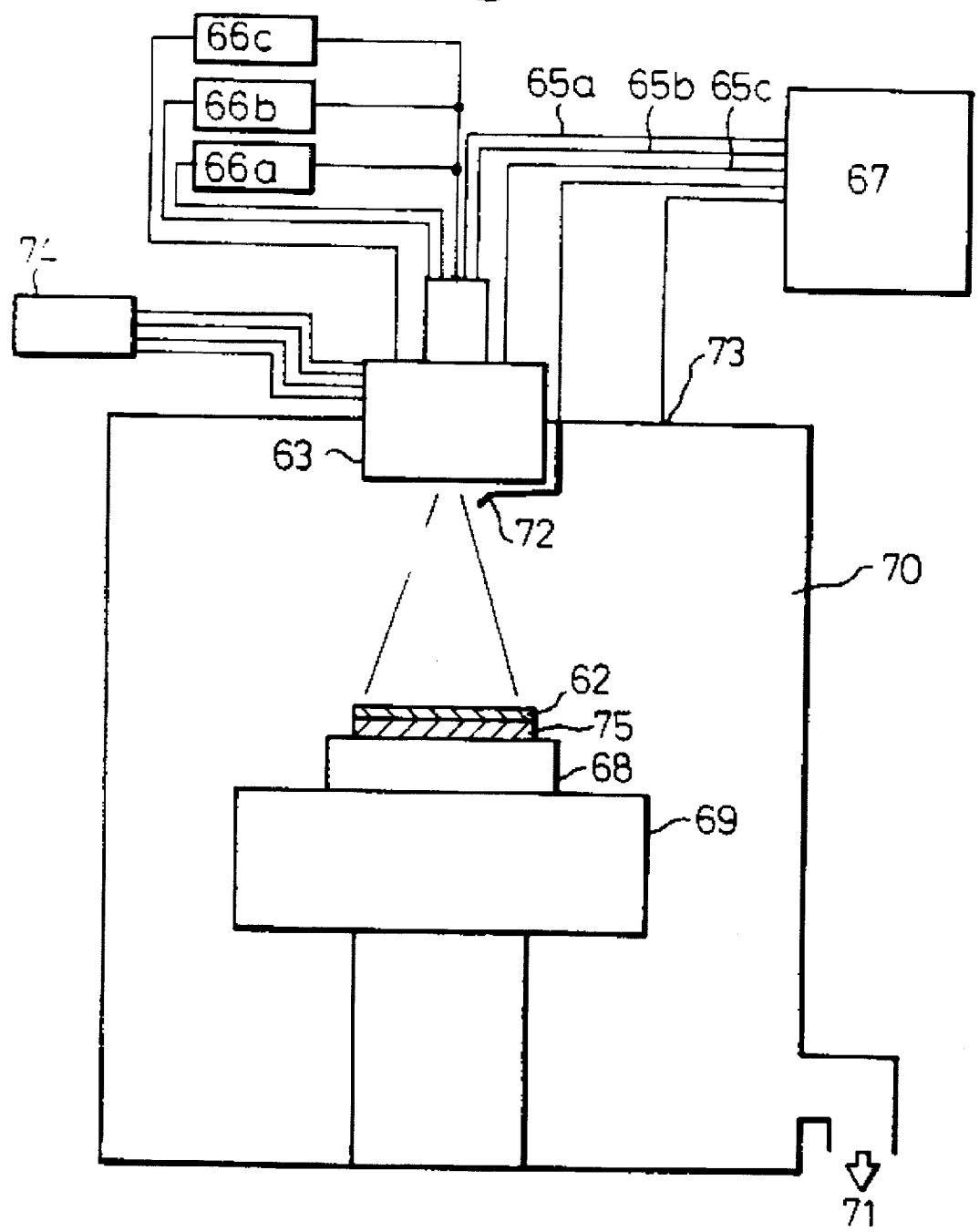
FIG. 17 is a schematic view of a diamond producing apparatus according to Example 12 of the present invention.

FIG. 16 and FIG. 17 are schematic views of a three-clad anode type plasma torch having three anodes arranged coaxially with the cathode core provided with a deflecting magnetic field device according to the present invention and a diamond synthesis apparatus using this torch. In the figure, 54 is a cathode, 55a is a first anode, 55b is a second anode, 55c is a third anode, 56 is an insulator, 57 is a permanent magnet, 58 is a yoke, 59 is a coil, 60 is an arc, 61 is a plasma jet, 62 is a diamond film, 63 is a plasma torch with a magnetic field generator, 64 is cooling water, 65a is a first gas, 65b is a second gas, 65c is a third gas, 66a is a first power source, 66b is a second power source, 66c is a third power source, 67 is a gas feed system, 68 is a substrate holder, 69 is a manipulator, 70 is a chamber, 71 is an exhaust system, 72 is a feedstock gas introduction nozzle, 73 is an atmospheric gas introduction port, 74 is a magnetic field generator power source, and 75 is a substrate.

The torch has a cathode 54 and three anodes 55a, 55b, and 55c comprised of water-cooled tungsten. The nozzle diameter of the third anode 55c is 40 mm. The second and the third anodes are provided with Nd—Fe—B system permanent magnets 57 treated to prevent rusting. The magnetic field of the permanent magnets 57 is applied in the axial direction of the torch to promote rotation of the anode point. A total of four electromagnets for generating a deflecting magnetic field are disposed in the X and Y two directions. The coil is water-cooled. The power source for the magnetic field generator is comprised of X, Y two system AC power sources with phases differing by 90° and a variable frequency. These can be changed in output current independently. The magnetic flux density generated was a maximum 1000 Gauss at the center axis.

The water-cooled copper substrate holder is positioned on a manipulator movable in the XYZ directions. The chamber is of a two-layer water-cooled construction and is connected to a mechanical booster pump and rotary pump. There are gas feed ports at three locations in the torch and two locations at the torch outlet and the chamber wall. Usually, Ar is fed as the first gas, hydrogen as the second gas, and hydrogen as the third gas. Methane, the source of the carbon, is fed from the five feed ports in accordance with need.

As the substrate, use is made of an Mo substrate of 100×100×5 mm. A diamond film is synthesized on the surface by the following procedure.

1) The inside of the chamber was exhausted to less than 0.01 Torr, then 10 liters/minute of Ar was introduced as the first gas, 20 liters/minute of hydrogen and 0.6 liter/minute as the second gas, and 10 liters/minute of hydrogen as the third gas.

2) First, discharge was caused at a first anode current of 20A by applying a potential between the cathode 54 and the first anode 55a.

3) Next, discharge was caused at a second anode current of 40A by applying a potential between the cathode 54 and the second anode 55b.

4) Next, discharge was caused at a third anode current of 60A by applying a potential between the cathode 54 and the third anode 55c. The overall discharge power at this time became 20 kW.

5) The deflecting magnetic field generator was operated to generate a magnetic field with a frequency of 100 Hz and a peak magnetic flux density of 500 Gauss.

6) The pressure in the chamber was made 50 Torr and the torch was brought close to the substrate holder to make the substrate surface temperature 1000° C.

7) Diamond was synthesized under these conditions for one hour.

8) The synthesized diamond was examined by a scanning type electron microscope (SEM), the quality of the diamond was evaluated by X-ray diffraction and Raman spectroscopy, and the concentration of impurities was analyzed by secondary ion mass spectrometry (SIMS).

Figure 18:
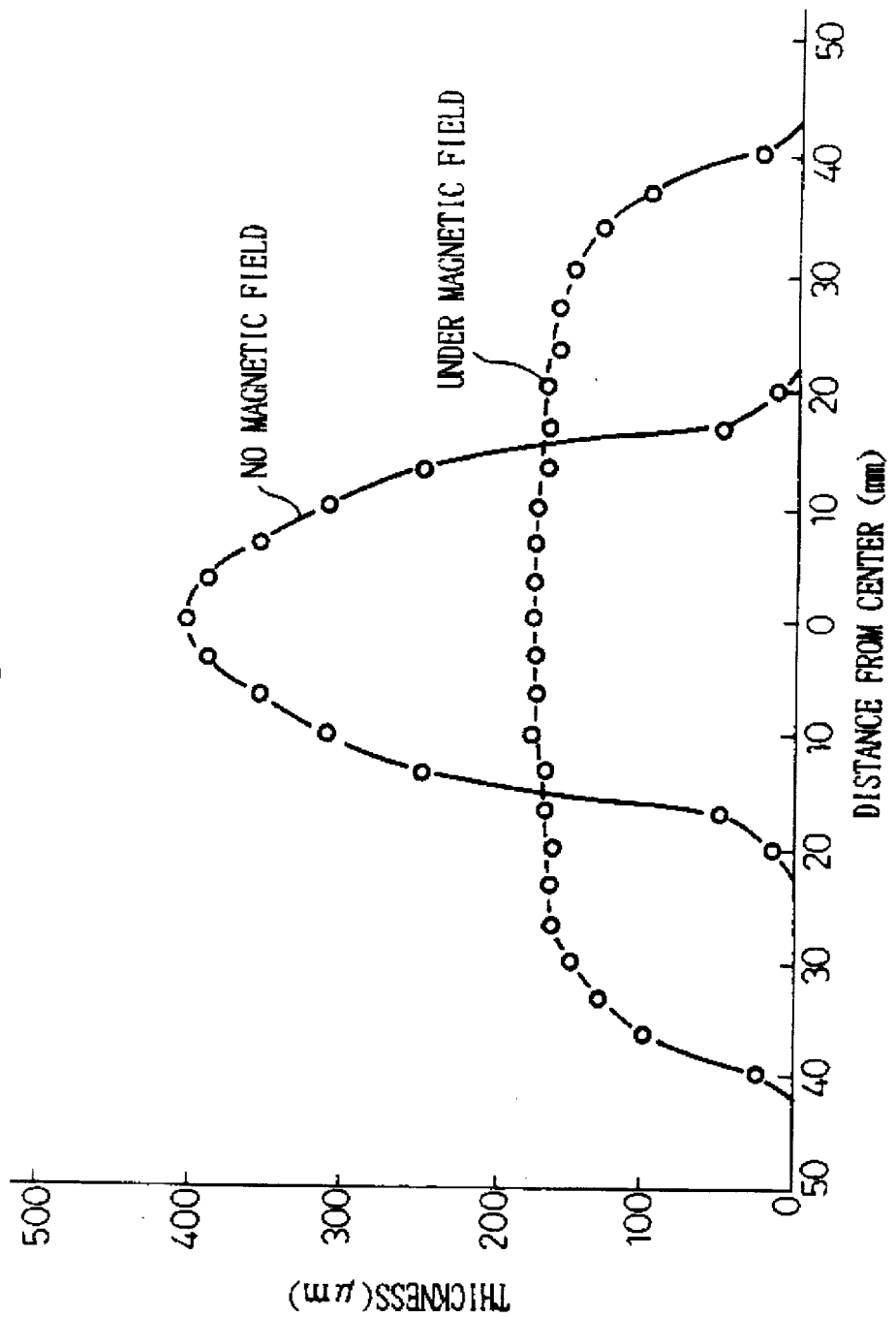
FIG. 18 is a graph showing the distribution of thickness of a diamond film synthesized in Example 12 of the present invention.

FIG. 18 shows the distribution of thickness of the synthesized diamond film. Further, for comparison, FIG. 18 also shows the distribution of thickness in the case of synthesis of diamond under the same conditions as Example 11 except that no deflecting magnetic field was applied. Without the deflecting magnetic field, the area of film formation was about 40 mm diameter with the center portion being thicker, while with the application of the deflecting magnetic field, a substantially uniform thickness was obtained over an approximately 60 mm diameter. A look at the speed of film formation shows that the speed of film formation at the center portion fell due to the application of the magnetic field, but that there was almost no change when viewed in terms of the speed of film formation by volume. Further, in the X-ray diffraction, only the diamond peak was detected, while with Raman spectroscopy, only the diamond peak of 1333 $cm^{-1}$ was detected. No graphite or amorphous carbon were detected. Further, the results of the analysis by SIMS showed that the concentration of tungsten, the electrode material, was under 0.1 ppm.

Example 13

Figure 19:
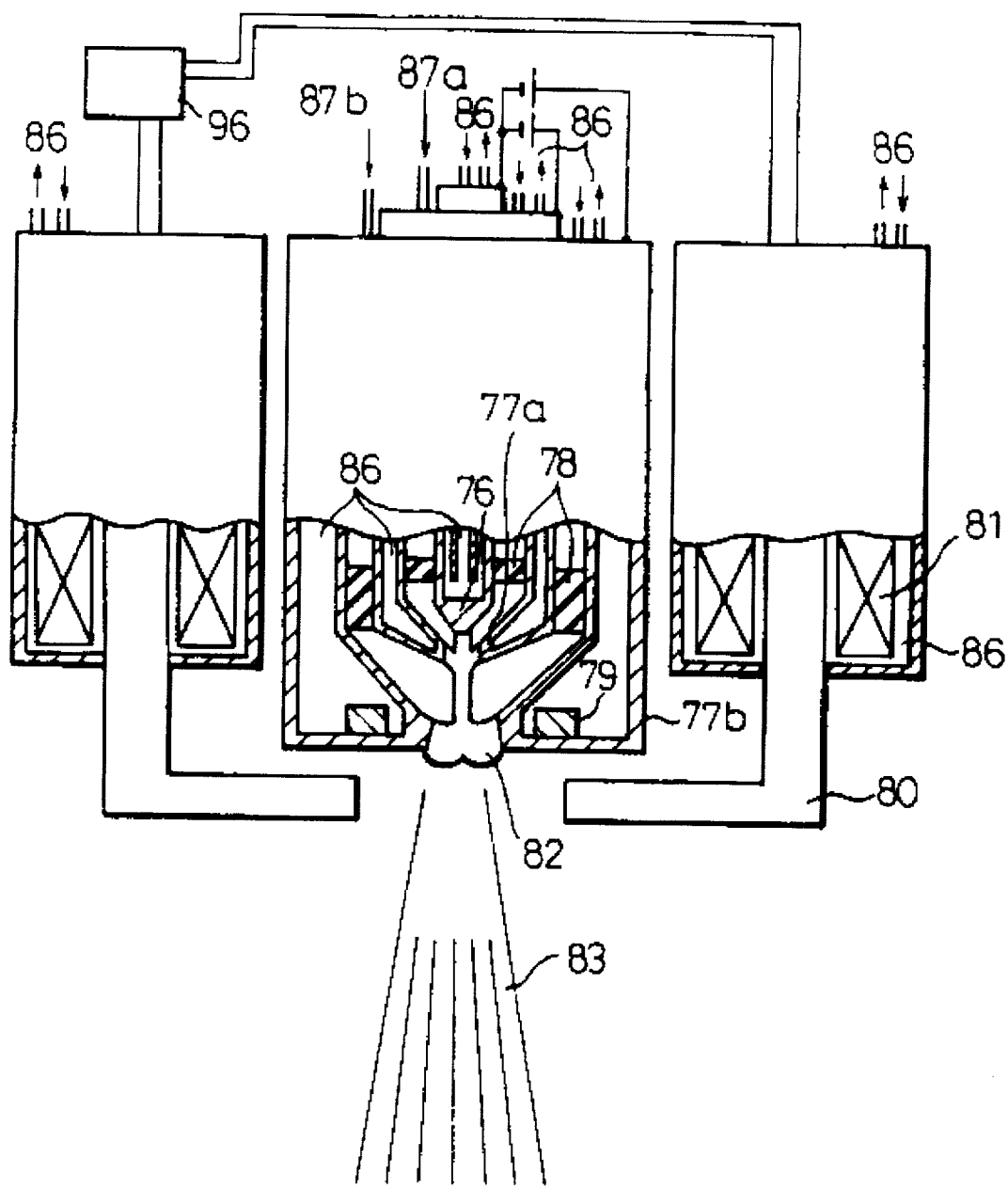
FIG. 19 is a schematic view of a diamond producing apparatus according to Example 13 of the present invention.
Figure 20:
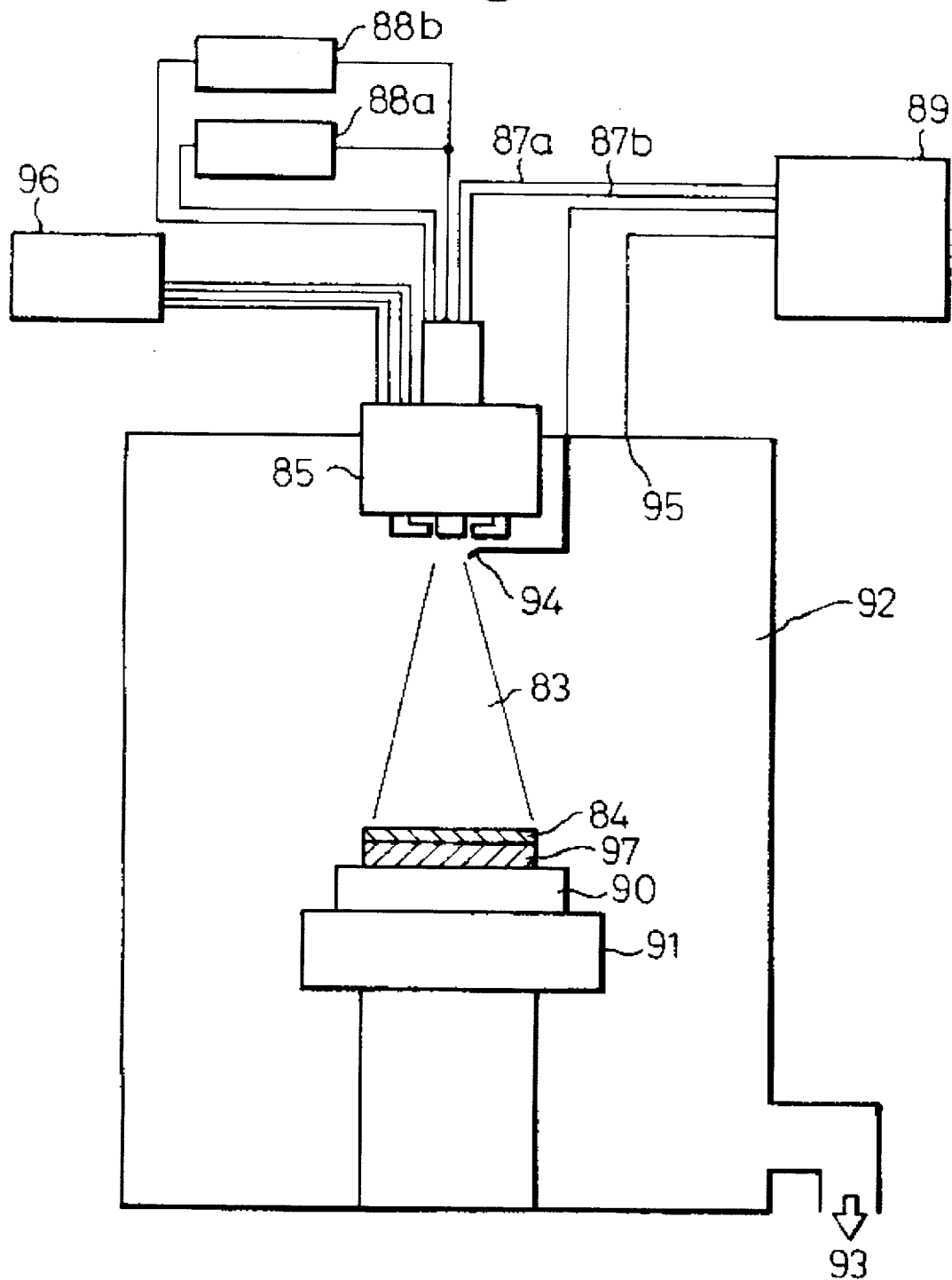
FIG. 20 is a schematic view of a diamond producing apparatus according to Example 13 of the present invention.

FIG. 19 and FIG. 20 are schematic views of a two-clad anode type plasma torch having two anodes arranged coaxially with the cathode core provided with a deflecting magnetic field device according to the present invention and a diamond synthesis apparatus using this torch. In the figure, 76 is a cathode, 77a is a first anode, 77b is a second anode, 78 is an insulator, 79 is a permanent magnet, 80 is a yoke, 81 is a coil, 82 is an arc, 83 is a plasma jet, 84 is a diamond film, 85 is a plasma torch with a magnetic field generator, 86 is cooling water, 87a is a first gas, 87b is a second gas, 88a is a first power source, 88b is a second power source, 89 is a gas feed system, 90 is a substrate holder, 91 is a manipulator, 92 is a chamber, 93 is an exhaust system, 94 is a feedstock gas introduction nozzle, 95 is an atmospheric gas introduction port, 96 is a magnetic field generator power source, and 97 is a substrate.

The torch has a cathode 76 and two anodes 77a, 77b comprised of water-cooled tungsten. The nozzle diameter of the second anode is 5 mm. The second anode 77b is provided with an Nd—Fe—B system permanent magnet treated to prevent rusting. The magnetic field is applied in the axial direction of the torch to promote rotation of the anode point. A total of four electromagnets for generating a deflecting magnetic field are disposed in the X and Y two directions. The coil is water-cooled. The power source for the magnetic field generator is comprised of X, Y two system AC power sources with phases differing by 90° and a variable frequency. These can be changed in output current independently. The magnetic flux density generated was a maximum 1000 Gauss at the center axis.

The water-cooled copper substrate holder is positioned on a manipulator movable in the XYZ directions. The chamber is of a two-layer water-cooled construction and is connected to a mechanical booster pump and rotary pump. There are gas feed ports at two locations in the torch and two locations at the torch outlet and the chamber wall. Usually, Ar is fed as the first gas and hydrogen as the second gas. Methane, the source of the carbon, is fed from the four feed ports in accordance with need.

As the substrate, use is made of an Mo substrate of 100×100×5 mm. A diamond film is synthesized on the surface by the following procedure.

1) The inside of the chamber was exhausted to less than 0.01 Torr, then 10 liters/minute of Ar was introduced as the first gas, 20 liters/minute of hydrogen as the second gas, and 0.4 liter/minute of methane as the starting gas.

2) First, discharge was caused at a first anode current of 20A by applying a potential between the cathode 76 and the first anode 77a.

3) Next, discharge was caused at a second anode current of 100A by applying a potential between the cathode 76 and the second anode 77b. The overall discharge power at this time became 15 kW.

4) The deflecting magnetic field generator was operated to generate a magnetic field with a frequency of 100 Hz and a peak magnetic flux density of 500 Gauss.

5) The pressure in the chamber was made 50 Torr and the torch was brought close to the substrate holder to make the substrate surface temperature 1000° C.

6) Diamond was synthesized under these conditions for one hour.

7) The synthesized diamond was examined by a scanning type electron microscope (SEM), the quality of the diamond was evaluated by X-ray diffraction and Raman spectroscopy, and the concentration of impurities was analyzed by secondary ion mass spectrometry (SIMS).

Figure 21:
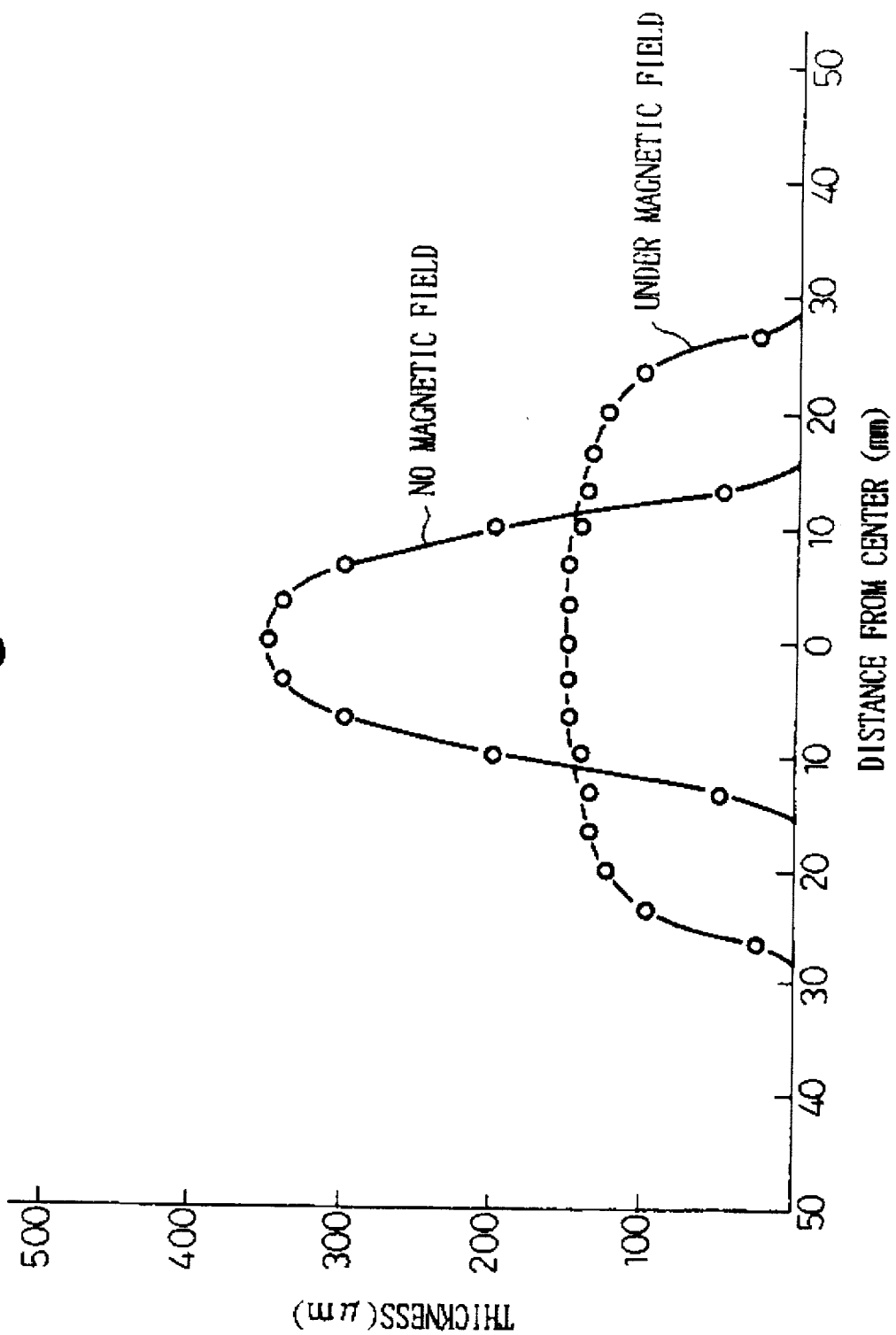
FIG. 21 is a graph showing the distribution of thickness of the diamond film synthesized in Example 13 of the present invention.

FIG. 21 shows the distribution of thickness of the synthesized diamond film. Further, for comparison, FIG. 21 also shows the distribution of thickness in the case of synthesis of diamond under the same conditions as Example 12 except that no deflecting magnetic field was applied. Without the deflecting magnetic field, the area of film formation was about 30 mm diameter with the center portion being thicker, while with the application of the deflecting magnetic field, a substantially uniform thickness was obtained over an approximately 40 mm diameter. A look at the speed of film formation shows that the speed of film formation at the center portion fell due to the application of the defecting magnetic field, but that there was almost no change when viewed in terms of the speed of film formation by volume. Further, in the X-ray diffraction, only the diamond peak was detected, while with Raman spectroscopy, only the diamond peak of 1333 $cm^{-1}$ was detected. No graphite or amorphous carbon were detected. Further, the results of the analysis by SIMS showed that the concentration of tungsten, the electrode material, was under 0.1 ppm.

By using the deflecting magnetic field applying torch of the present invention, it is possible to increase the area of irradiation of the plasma jet and increase the area of synthesis of the diamond.

Example 14

Figure 22:
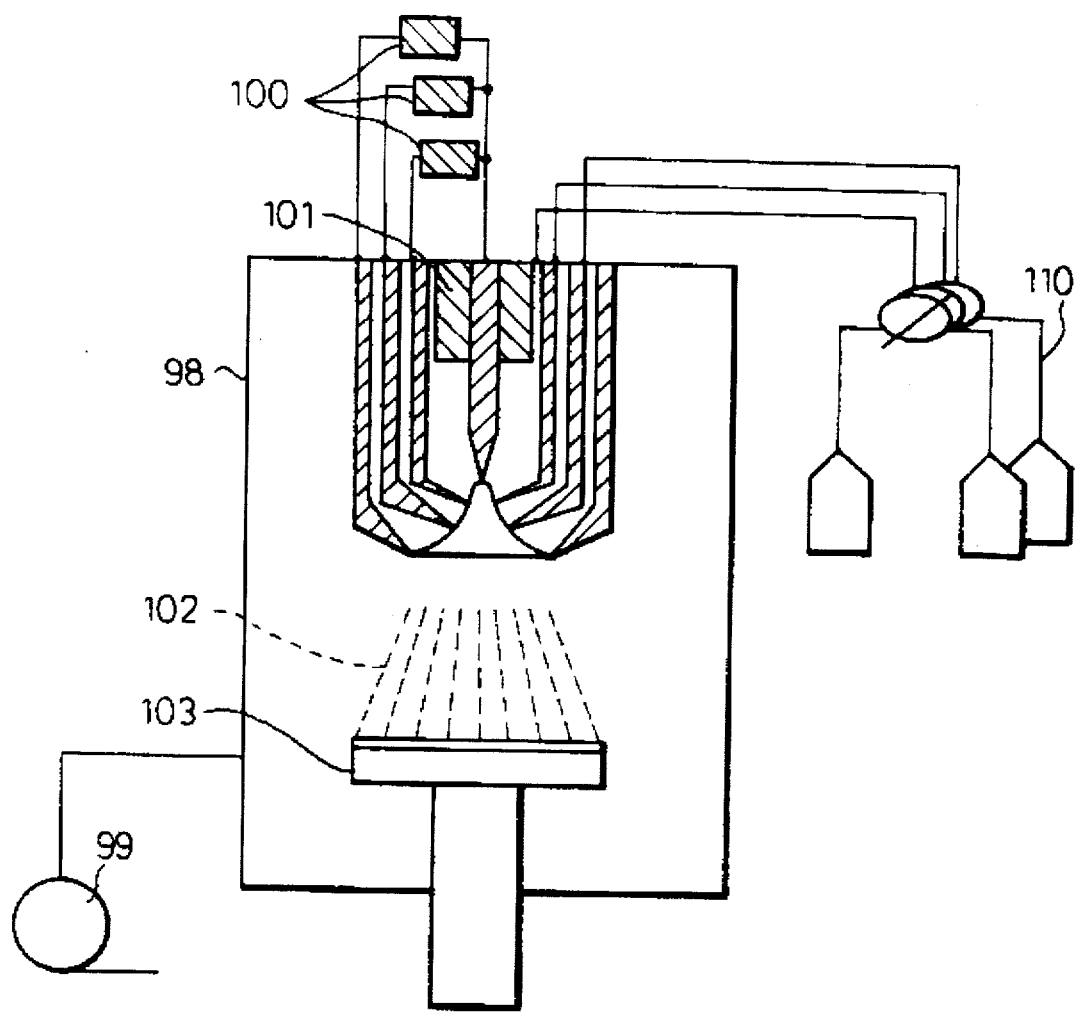
FIG. 22 is a schematic view of a diamond producing apparatus according to Example 14 of the present invention.

As shown in FIG. 22, first, the inside of the chamber 98 was exhausted by the vacuum pump 99 to about $10^{-2}$ Torr. After this, 10 liters/minute of Ar was introduced as the first gas, 20 liters/minute of hydrogen and 0.6 liter/minute of methane as the second gas, and 10 liters/minute of hydrogen as the third gas (gas system 110).

The pressure inside the chamber 98 was made 50 Torr and the DC power source 100 was used to start discharge at a first anode current of 20A, a second anode current of 40A, and a third anode current of 30A. In the torch was placed a permanent magnet 101 so as to generate a magnetic field downward with the cathode as the axial line. The magnetic field at the front end of the torch was measured at this time and found to be 2000 Gauss. The plasma jet 102 was irradiated on to the substrate fixed on the water-cooled substrate holder 103 from the front end of the plasma torch, whereby diamond was produced.

Figure 23:
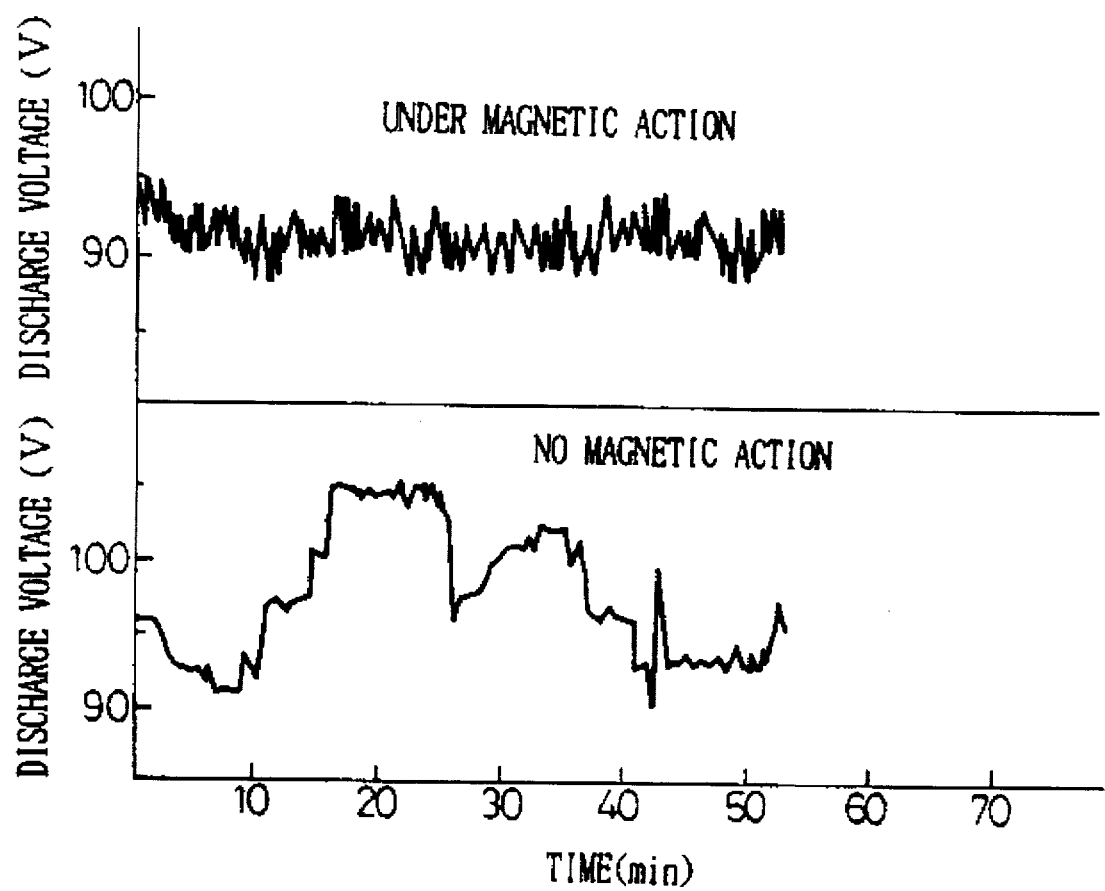
FIG. 23 is a graph showing the changes over time of the discharge voltage in Example 14 of the present invention.

The stability of the discharge can be examined by the voltage across the anodes and cathode, that is, the discharge voltage. Examination of the change of the discharge voltage over time gave the results shown in FIG. 23. That is, it was learned that the discharge voltage was equalized and stabilized.

Example 15

As shown in FIG. 24, first, the inside of the chamber 104 was exhausted by the vacuum pump 105 to about $10^{-2}$ Torr. After that, 10 liters/minute of Ar was introduced as the first gas, 20 liters/minute of hydrogen and 0.6 liter/minute of methane were introduced as the second gas, and 10 liters/minute of hydrogen was introduced as the third gas.

The pressure inside the chamber 104 was made 50 Torr and the DC power source 106 was used to start discharge at a first anode current of 20A, a second anode current of 40A, and a third anode current of 30A. At the same time as this, the outermost arranged third anode electrode was rotated at 60 rpm by the anode rotation motor 107. The plasma jet 108 was irradiated on to the substrate fixed on the water-cooled substrate holder 109 from the front end of the plasma torch, whereby diamond was produced. Note that 110 shows the gas system.

Figure 25:
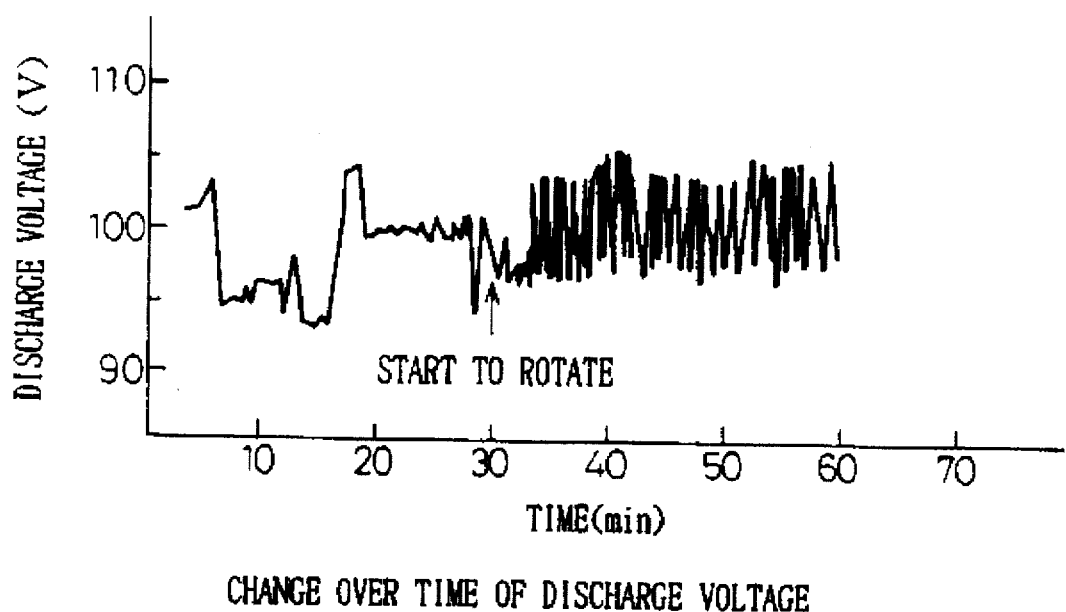
FIG. 25 is a graph showing the changes over time of the discharge voltage in Example 15 of the present invention.

The stability of the discharge may be investigated using the voltage across the third anode and cathode, that is, the discharge voltage. If the change of the discharge voltage over time is investigated, one gets FIG. 25. That is, it was learned that the discharge voltage was equalized and made stable.

Further, a similar effect can also be obtained by moving the cathode.

We claim:

1. A process for producing diamond, comprising the steps of:
   (a) bringing both a columnar cathode and a tubular pilot anode, provided concentrically around said cathode set apart with a clearance from said cathode, into proximity to a plasma jetting port of a front end portion of a tubular main anode, provided concentrically around said pilot anode set apart with a clearance from said pilot anode,
   (b) applying a discharge voltage across said cathode and said pilot anode to convert a pilot gas introduced in the clearance between said cathode and said pilot anode to a plasma,
   (c) after step (b), moving the cathode which is close to said pilot anode away from said pilot anode along a common axis,
   (d) holding the discharge voltage across said cathode and said pilot anode to a first preselected voltage,
   (e) after step (d), applying a discharge voltage across said cathode and said main anode to convert a main gas introduced in the clearance between said main anode and said pilot anode to a plasma,
   (f) after step (e), moving at least the pilot anode which is close to the main anode away from the main anode along said common axis while maintaining the discharge voltage across said cathode and said pilot anode at the first preselected voltage,
   (g) holding the discharge voltage across said cathode and said main anode to a second preselected voltage, and
   (h) jetting the main gas in the form of plasma from said jetting port toward a substrate while generating a main arc between said main anode and said cathode and maintaining the second preselected voltage, thereby producing diamond on the substrate.

2. A process as set forth in claim 1, wherein said pilot gas is argon gas or another inert gas and said main gas is a mixed gas of hydrogen gas or an inert gas and a gas comprised of a carbon compound used as a feedstock gas.

3. A process as set forth in claim 1, which introduces a gas including a feedstock gas into the plasma jet from the plasma jetting port of said main anode.

4. A process as set forth in claim 3, wherein said pilot gas is argon gas or another inert gas, said main gas is hydrogen gas or an inert gas, and said feedstock gas is a gas comprised of a carbon compound.

5. A process as set forth in claim 1, wherein said diamond is produced in a chamber having a reduced pressure, and atmospheric gas is introduced into said chamber from a gas introduction port in a wall of said chamber.

6. A process as set forth in claim 5, wherein said pilot gas is argon gas or another inert gas, said main gas is hydrogen gas or an inert gas, and said atmospheric gas is a gas comprised of a carbon compound.

7. A process as set forth in claim 5, wherein said pilot gas is argon gas or another inert gas, said main gas is hydrogen gas or an inert gas, and said atmospheric gas is a mixed gas comprised of a gas comprising a carbon compound, an oxidizing gas, a halogen gas, and a halogenated hydrogen gas.

* * * * *

UNITED STATES PATENT AND TRADEMARK OFFICE
CERTIFICATE OF CORRECTION

PATENT NO. : 5,538,765
DATED : July 23, 1996
INVENTOR(S) : Kazuaki KURIHARA et al.

It is certified that error appears in the above-indentified patent and that said Letters Patent is hereby corrected as shown below:

Col. 1, line 42, change "printed" to --pointed--.

Col. 3, line 24, change "Jetted" to --jetted-.

Col. 4, line 45, change "Jet" to --jet--.

Signed and Sealed this

Eleventh Day of February, 1997

Attest:

BRUCE LEHMAN

*Attesting Officer*     *Commissioner of Patents and Trademarks*